United States Patent
Ogasawara et al.

(10) Patent No.: US 12,296,714 B2
(45) Date of Patent: May 13, 2025

(54) CHARGE AND DISCHARGE CONTROL DEVICE AND CHARGE AND DISCHARGE CONTROL METHOD INCLUDING FIRST, SECOND, AND THIRD CHARGE LEVEL RANGES

(71) Applicant: Mitsubishi Electric Corporation, Tokyo (JP)

(72) Inventors: Keisuke Ogasawara, Tokyo (JP); Tomoki Takegami, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 742 days.

(21) Appl. No.: 17/599,561

(22) PCT Filed: Jun. 12, 2019

(86) PCT No.: PCT/JP2019/023296
§ 371 (c)(1),
(2) Date: Sep. 29, 2021

(87) PCT Pub. No.: WO2020/250342
PCT Pub. Date: Dec. 17, 2020

(65) Prior Publication Data
US 2022/0200313 A1 Jun. 23, 2022

(51) Int. Cl.
*B60L 58/16* (2019.01)
*B60L 58/13* (2019.01)
(Continued)

(52) U.S. Cl.
CPC .............. *B60L 58/16* (2019.02); *B60L 58/13* (2019.02); *G01R 31/392* (2019.01);
(Continued)

(58) Field of Classification Search
CPC .. H02J 7/00712; H02J 7/00032; H02J 7/0013; H02J 7/0048; H02J 7/005;
(Continued)

(56) References Cited

U.S. PATENT DOCUMENTS 5,373,196 A * 12/1994 Faley ...................... H02J 9/062
307/64
5,939,864 A * 8/1999 Lenhart ................. H02J 7/0071
429/50

(Continued)

FOREIGN PATENT DOCUMENTS

| CN | 103080762 B | * | 1/2016 | ......... G01R 31/3679 |
| EP | 3007310 A2 | * | 4/2016 | .......... H01M 10/441 |

(Continued)

OTHER PUBLICATIONS

JP2010097760_Machine_Translation (Year: 2010).*

(Continued)

*Primary Examiner* — John T Trischler
(74) *Attorney, Agent, or Firm* — XSENSUS LLP

(57) ABSTRACT

A charge and discharge control device includes a storage charge level determining unit that selects one range from a first charge level range lower than a second charge level range and a third charge level range higher than the second charge level range, and determines a charge level at storage during which charge and discharge of a battery are not performed. The second charge level range can be a range of charge level including a maximum value of storage degradation, and the storage degradation can be degradation of the battery over time. The charge and discharge control device can further comprise a charge and discharge control unit that controls charge and discharge of the battery on the basis of the charge level at storage.

13 Claims, 17 Drawing Sheets

(51) Int. Cl.
   *G01R 31/392*   (2019.01)
   *H01M 10/44*    (2006.01)
   *H01M 10/48*    (2006.01)
   *H02J 7/00*     (2006.01)
   *B60L 58/12*    (2019.01)
   *H02J 7/34*     (2006.01)

(52) U.S. Cl.
   CPC ....... *H01M 10/441* (2013.01); *H01M 10/482* (2013.01); *H02J 7/005* (2020.01); *H02J 7/0071* (2020.01); *B60L 58/12* (2019.02); *H02J 7/00032* (2020.01); *H02J 7/0013* (2013.01); *H02J 7/0048* (2020.01); *H02J 7/00712* (2020.01); *H02J 7/342* (2020.01)

(58) Field of Classification Search
   CPC ...... H02J 7/342; H02J 7/0071; H01M 10/441; H01M 10/482; B60L 53/53; B60L 58/16; B60L 58/13; G01R 31/392
   USPC .................................................. 320/103, 134
   See application file for complete search history.

(56) References Cited

U.S. PATENT DOCUMENTS

| | | | | |
|---|---|---|---|---|
| 6,911,804 B2* | 6/2005 | Mori | ........................ | G06F 1/263 320/132 |
| 7,211,987 B2* | 5/2007 | Aoki | ................... | H01M 10/44 324/425 |
| 8,482,253 B2* | 7/2013 | Yen | ........................ | H02J 7/007 320/128 |
| 8,587,254 B2* | 11/2013 | Kobayashi | .......... | H01M 10/443 320/137 |
| 8,729,861 B2* | 5/2014 | Nishida | ................. | H01M 10/46 320/152 |
| 8,907,674 B2* | 12/2014 | Takahashi | .............. | H01M 10/42 324/432 |
| 8,970,178 B2* | 3/2015 | Berkowitz | ............ | H01M 10/44 320/141 |
| 9,121,911 B2* | 9/2015 | Takahashi | ........... | H01M 10/482 |
| 9,176,195 B2* | 11/2015 | Maeda | .................... | B60L 58/15 |
| 9,291,682 B2* | 3/2016 | Kinjo | ................ | G01R 31/3835 |
| 9,350,190 B2* | 5/2016 | Iwamoto | ............... | H02J 7/0069 |
| 9,472,976 B2* | 10/2016 | Luo | ........................... | H02J 7/04 |
| 9,527,400 B2* | 12/2016 | Rhodes | ............... | B60L 15/2045 |
| 9,547,046 B2* | 1/2017 | Tao | .................... | G01R 31/392 |
| 9,678,167 B2* | 6/2017 | Goto | .................... | G01R 31/392 |
| 9,702,940 B2* | 7/2017 | Maluf | ..................... | B60L 58/12 |
| 9,787,133 B2* | 10/2017 | Liang | ..................... | H02M 7/08 |
| 9,846,202 B2* | 12/2017 | Kim | ..................... | B60L 58/16 |
| 9,853,476 B2* | 12/2017 | Lee | ..................... | H02J 7/00047 |
| 9,871,275 B2* | 1/2018 | Ishibashi | ........... | H01M 10/0525 |
| 9,979,210 B2* | 5/2018 | Takao | ................... | H02J 7/0016 |
| 10,001,528 B1 | 6/2018 | Matsuyama | .......... | H01M 10/42 |
| 10,081,268 B2* | 9/2018 | Obata | ................... | H01M 10/48 |
| 10,126,367 B2* | 11/2018 | Lee | ..................... | H01M 10/0525 |
| 10,164,448 B2* | 12/2018 | Tanaka | ................... | H02J 7/0013 |
| 10,170,921 B2* | 1/2019 | Yechieli | ..................... | H02J 7/02 |
| 10,181,622 B2* | 1/2019 | Arai | ..................... | H01M 10/4257 |
| 10,195,948 B2* | 2/2019 | O'Hara | ................... | B60L 58/15 |
| 10,261,136 B2* | 4/2019 | Hosaka | ................ | G01R 31/392 |
| 10,283,820 B2* | 5/2019 | Sugeno | ................ | H02J 7/0029 |
| 10,355,509 B2* | 7/2019 | Sada | .................... | H02J 3/003 |
| 10,371,753 B1* | 8/2019 | Wang | ................... | H01M 10/48 |
| 10,447,056 B2* | 10/2019 | Tamburrino | ............ | H02J 7/007 |
| 10,490,864 B2* | 11/2019 | Oniki | ................... | H01M 10/0525 |
| 10,505,376 B2* | 12/2019 | Sugeno | ............ | H01M 10/0525 |
| 10,566,815 B2* | 2/2020 | Fujita | ................ | H01M 10/425 |
| 10,644,517 B2* | 5/2020 | Huang | ................ | H01M 10/425 |
| 10,677,853 B2* | 6/2020 | Laughery | ................ | H02J 7/007 |
| 10,840,720 B2* | 11/2020 | Yebka | ................... | H02J 7/0049 |
| 10,845,421 B2* | 11/2020 | Yamamoto | ........... | G01R 31/386 |
| 10,958,082 B2* | 3/2021 | Solomon | ................... | H02J 7/00 |
| 11,022,653 B2* | 6/2021 | Shimosawa | ........... | H01M 10/48 |
| 11,085,970 B2* | 8/2021 | Koyamada | ........... | H01M 10/46 |
| 11,165,270 B2* | 11/2021 | Owen | ................ | H01M 10/425 |
| 11,214,168 B2* | 1/2022 | Aoyama | ................ | B60L 58/13 |
| 11,226,376 B2* | 1/2022 | Yamauchi | ........... | G01R 31/396 |
| 11,275,122 B2* | 3/2022 | Sada | ................... | G01R 31/3842 |
| 11,415,631 B2* | 8/2022 | Yoon | ................... | G01R 31/382 |
| 11,422,190 B2* | 8/2022 | Hara | ................... | H02J 7/005 |
| 11,428,747 B2* | 8/2022 | Ukumori | ............... | H01M 10/48 |
| 11,448,709 B1* | 9/2022 | Kondo | ................ | G01R 31/3842 |
| 11,456,492 B2* | 9/2022 | Min | ................... | G01R 31/3842 |
| 11,467,218 B2* | 10/2022 | Ogasawara | .......... | G01R 31/389 |
| 11,502,530 B2* | 11/2022 | Hayayama | .......... | B60L 58/12 |
| 11,527,900 B2* | 12/2022 | Kim | ..................... | B60L 58/16 |
| 11,605,965 B2* | 3/2023 | Lee | ..................... | H02J 7/00034 |
| 11,656,282 B2* | 5/2023 | Fujino | ....................... | H02J 7/00 324/426 |
| 11,824,395 B2* | 11/2023 | Bae | ................... | H02J 7/007184 |
| 11,949,257 B2* | 4/2024 | Itakura | ............... | G01R 31/3835 |
| 11,977,126 B1* | 5/2024 | Ozkan | .................. | G01R 31/367 |
| 11,987,147 B2* | 5/2024 | Geantil | ................ | H01M 10/48 |
| 12,081,058 B2* | 9/2024 | Jung | ................ | G01R 31/382 |
| 12,153,096 B2* | 11/2024 | Sada | ................... | H01M 10/441 |
| 2002/0075003 A1* | 6/2002 | Fridman | ................... | H02J 7/005 324/426 |
| 2003/0048006 A1* | 3/2003 | Shelter, Jr. | ............... | H02J 9/061 307/64 |
| 2003/0057918 A1* | 3/2003 | Aoki | ..................... | H02J 7/0048 320/136 |
| 2004/0066171 A1* | 4/2004 | Mori | ......................... | G06F 1/28 320/132 |
| 2010/0052617 A1* | 3/2010 | Aridome | ................ | B60L 58/16 320/132 |
| 2010/0207580 A1* | 8/2010 | Nishida | ................. | H01M 4/505 320/132 |
| 2011/0127965 A1* | 6/2011 | Yen | .......................... | H02J 7/007 320/128 |
| 2012/0049804 A1* | 3/2012 | Kobayashi | .......... | H01M 10/443 320/150 |
| 2012/0112700 A1* | 5/2012 | Morimoto | ......... | H02J 7/007182 320/132 |
| 2012/0200266 A1* | 8/2012 | Berkowitz | ............ | H01M 10/44 320/139 |
| 2013/0009605 A1* | 1/2013 | Hongo | ................... | H02J 7/0013 320/134 |
| 2013/0076363 A1* | 3/2013 | Takahashi | .............. | H01M 10/42 324/427 |
| 2013/0099794 A1* | 4/2013 | Takahashi | .............. | H01M 10/48 324/427 |
| 2013/0271148 A1* | 10/2013 | Maeda | ................. | G01R 31/392 324/426 |
| 2013/0278221 A1* | 10/2013 | Maeda | ................. | G01R 31/392 320/134 |
| 2013/0282316 A1* | 10/2013 | Goto | ...................... | H01M 10/48 702/63 |
| 2013/0314050 A1* | 11/2013 | Matsubara | ................ | H02J 7/00 320/134 |
| 2014/0253049 A1* | 9/2014 | Iwamoto | ................ | H02J 7/0069 320/162 |
| 2014/0333265 A1* | 11/2014 | Kinjo | ................ | G01R 31/392 320/134 |
| 2015/0057957 A1* | 2/2015 | Kim | ..................... | G01R 31/392 702/63 |
| 2015/0076915 A1* | 3/2015 | Liang | ..................... | H02M 7/08 307/66 |
| 2015/0130404 A1* | 5/2015 | Luo | ........................... | H02J 7/04 320/137 |
| 2015/0153417 A1* | 6/2015 | Maluf | .................. | G01R 31/382 324/426 |
| 2015/0301123 A1* | 10/2015 | Tao | ........................... | H02J 7/00 324/426 |
| 2015/0346285 A1* | 12/2015 | Igarashi | ................ | G01R 31/392 324/432 |
| 2016/0079787 A1* | 3/2016 | Yechieli | ..................... | H02J 7/00 320/138 |
| 2016/0105044 A1* | 4/2016 | Yamaguchi | ........... | H02J 7/0013 320/112 |

(56) References Cited

U.S. PATENT DOCUMENTS

| | | | | |
|---|---|---|---|---|
| 2016/0141893 | A1* | 5/2016 | Lee | H02J 7/00047 320/134 |
| 2016/0190658 | A1* | 6/2016 | Ishibashi | H02J 7/0048 324/432 |
| 2016/0218525 | A1* | 7/2016 | Takao | H02J 7/005 |
| 2016/0221456 | A1* | 8/2016 | Rhodes | B60L 15/2045 |
| 2016/0268651 | A1* | 9/2016 | Arai | H02J 7/0013 |
| 2016/0351974 | A1* | 12/2016 | Oniki | G01R 31/382 |
| 2017/0102436 | A1* | 4/2017 | Tao | G01R 31/392 |
| 2017/0120774 | A1* | 5/2017 | Obata | B60L 58/26 |
| 2017/0131364 | A1* | 5/2017 | Hosaka | G01R 31/36 |
| 2017/0133863 | A1* | 5/2017 | Tamburrino | H01M 10/46 |
| 2017/0234930 | A1* | 8/2017 | Lee | H01M 10/0525 320/162 |
| 2017/0271889 | A1* | 9/2017 | Sugeno | H01M 50/213 |
| 2017/0294689 | A1* | 10/2017 | Wada | H02J 7/0049 |
| 2017/0338668 | A1* | 11/2017 | Sada | H02J 3/32 |
| 2017/0366023 | A1* | 12/2017 | Tanaka | H01M 10/425 |
| 2018/0076633 | A1* | 3/2018 | Fujita | H02J 7/00047 |
| 2018/0090950 | A1* | 3/2018 | Huang | H01M 10/441 |
| 2018/0115024 | A1* | 4/2018 | Sugeno | H02J 7/35 |
| 2018/0156873 | A1* | 6/2018 | Matsuyama | H01M 10/42 |
| 2018/0188330 | A1* | 7/2018 | Yamamoto | G01R 31/386 |
| 2018/0210036 | A1* | 7/2018 | Yamauchi | H02J 7/007194 |
| 2018/0246174 | A1* | 8/2018 | Shimosawa | G01R 31/389 |
| 2018/0257492 | A1* | 9/2018 | O'Hara | H02J 7/0032 |
| 2018/0372806 | A1* | 12/2018 | Laughery | H02J 7/00 |
| 2019/0305564 | A1* | 10/2019 | Yebka | H02J 7/007194 |
| 2019/0334353 | A1* | 10/2019 | Solomon | G06F 1/263 |
| 2019/0361076 | A1* | 11/2019 | Koyamada | H01M 10/0562 |
| 2020/0057113 | A1* | 2/2020 | Ukumori | G01R 31/392 |
| 2020/0132774 | A1* | 4/2020 | Hara | H02J 7/0047 |
| 2020/0150183 | A1* | 5/2020 | Yoon | G01R 31/367 |
| 2020/0153253 | A1* | 5/2020 | Tamburrino | H01M 10/488 |
| 2020/0247268 | A1* | 8/2020 | Aoyama | G01R 31/392 |
| 2020/0266649 | A1* | 8/2020 | Lee | H04W 52/027 |
| 2020/0303938 | A1* | 9/2020 | Owen | H01M 10/44 |
| 2020/0335979 | A1* | 10/2020 | Kim | H02J 7/0049 |
| 2020/0395775 | A1* | 12/2020 | Hayayama | B60L 58/22 |
| 2020/0408844 | A1* | 12/2020 | Ogasawara | G01K 13/00 |
| 2021/0021000 | A1* | 1/2021 | Sada | H02J 7/005 |
| 2021/0066945 | A1* | 3/2021 | Jung | H01M 10/052 |
| 2021/0103000 | A1* | 4/2021 | Fujino | G01R 31/392 |
| 2021/0218262 | A1* | 7/2021 | Bae | G01R 31/3835 |
| 2021/0242698 | A1* | 8/2021 | Kaushik | H02J 7/00716 |
| 2021/0296911 | A1* | 9/2021 | Itakura | B60L 3/0046 |
| 2021/0328270 | A1* | 10/2021 | Min | H02J 7/0013 |
| 2022/0082630 | A1* | 3/2022 | Takaoka | G01R 31/3842 |
| 2022/0140636 | A1* | 5/2022 | Yasugi | H02J 7/00712 320/134 |
| 2022/0161683 | A1* | 5/2022 | Geantil | B60L 58/16 |
| 2022/0181897 | A1* | 6/2022 | Nagabhushanrao | H02J 7/0047 |
| 2022/0224150 | A1* | 7/2022 | August | H02J 3/004 |
| 2022/0283239 | A1* | 9/2022 | Kondo | H02J 7/0048 |
| 2022/0294027 | A1* | 9/2022 | Choudhary | H02J 7/00036 |
| 2022/0407329 | A1* | 12/2022 | Tu | H02J 7/0071 |
| 2023/0014689 | A1* | 1/2023 | Ogasawara | G01R 31/392 |
| 2023/0118311 | A1* | 4/2023 | Asai | H01M 10/482 324/434 |
| 2023/0119394 | A1* | 4/2023 | Ferrieres | H02J 7/0029 320/134 |
| 2023/0137917 | A1* | 5/2023 | Suzuki | H02J 7/007182 702/63 |
| 2023/0179002 | A1* | 6/2023 | Tyagi | H02J 7/0048 |
| 2023/0243893 | A1* | 8/2023 | Shiraga | G01R 31/392 702/63 |
| 2023/0333165 | A1* | 10/2023 | Takegami | G01R 31/392 |
| 2023/0391221 | A1* | 12/2023 | Matsuda | H02J 7/0071 |
| 2023/0402924 | A1* | 12/2023 | Ogasawara | H02J 7/00 |
| 2024/0044994 | A1* | 2/2024 | Hirai | G01R 31/392 |
| 2024/0053408 | A1* | 2/2024 | Shiraga | G01R 31/371 |
| 2024/0288498 | A1* | 8/2024 | Takegami | G01R 31/392 |

FOREIGN PATENT DOCUMENTS

| | | | | |
|---|---|---|---|---|
| JP | 2010-97760 | A | 4/2010 | |
| JP | 2014-131412 | A | 7/2014 | |
| JP | 2016-73042 | A | 5/2016 | |
| JP | 2017-91602 | A | 5/2017 | |
| WO | WO-2009037881 | A1 * | 3/2009 | H01M 10/052 |
| WO | WO-2011039912 | A1 * | 4/2011 | G01R 31/367 |
| WO | 2011/118294 | A1 | 9/2011 | |
| WO | WO-2014132403 | A1 * | 9/2014 | B60L 11/1857 |
| WO | 2016/194082 | A1 | 12/2016 | |
| WO | 2017/033399 | A1 | 3/2017 | |
| WO | 2018/105645 | A1 | 6/2018 | |

OTHER PUBLICATIONS

International Search Report and Written Opinion mailed on Aug. 13, 2019, received for PCT Application PCT/JP2019/023296, Filed on Jun. 12, 2019, 10 pages including English Translation.

Notice of Reasons for Refusal mailed on Oct. 29, 2019, received for Japanese Application 2019-555042, 7 pages Including English Translation.

* cited by examiner

CHARGE AND DISCHARGE CONTROL DEVICE AND CHARGE AND DISCHARGE CONTROL METHOD INCLUDING FIRST, SECOND, AND THIRD CHARGE LEVEL RANGES

CROSS-REFERENCE TO RELATED APPLICATION

The present application is based on PCT filing PCT/JP2019/023296, filed Jun. 12, 2019, the entire contents of which are incorporated herein by reference.

FIELD

The present invention relates to a charge and discharge control device and a charge and discharge control method that reduces deterioration of batteries.

BACKGROUND

Batteries are known to experience cycle degradation, which is battery degradation caused by charge and discharge, and storage degradation, which is degradation over time even in a state in which batteries are not charged and discharged. The rate of storage degradation varies depending on the battery charge level. For example, for some electric vehicles, the parking time is longer than the driving time depending on the users' usage conditions. It is therefore important to reduce storage degradation during parking time.

Patent Literature 1 discloses a technology for reducing storage degradation of batteries that experience faster storage degradation as the charge level is higher. A storage battery system described in Patent Literature 1 generates a plurality of operation patterns, calculates a degradation amount in each of the generated operation patterns, and selects a pattern with the smallest degradation amount. Patent Literature 1 states that, because the battery degradation progresses faster as the charge level is higher, the charge level is controlled to be as low as possible.

CITATION LIST

Patent Literature

Patent Literature 1: International Publication No. WO 2018/105645

SUMMARY

Technical Problem

The storage degradation ratio of a battery, however, varies depending on the material of the battery, and not only batteries that experience faster storage degradation as the charge level is higher but also batteries that experience fast storage degradation in a middle range of charge level are present. With the technology described in Patent Literature 1, an operation pattern in which a battery is stored in a middle range of charge level may be selected, which is problematic in that storage degradation of a battery that experiences fast storage degradation in a middle range of charge level cannot be sufficiently reduced.

The present invention has been made in view of the above, and an object thereof is to provide a charge and discharge control device capable of reducing storage degradation of a battery that experiences fast storage degradation in a middle range of charge level.

Solution to Problem

A charge and discharge control device according to an aspect of the present invention includes: a storage charge level determining unit to select one range from a first charge level range a charge level of which is lower than a charge level of a second charge level range, and a third charge level range a charge level of which is higher than a charge level of the second charge level range, and determine a charge level at storage during which charge and discharge of a battery are not performed, the second charge level range being a range of charge level including a maximum value of storage degradation, the storage degradation being degradation of the battery over time; and a charge and discharge control unit to control charge and discharge of the battery on the basis of the charge level at storage.

Advantageous Effects of Invention

The present invention produces an effect of enabling reduction in storage degradation of a battery that experiences fast storage degradation in a middle range of charge level.

DESCRIPTION OF EMBODIMENTS

Figure 1:
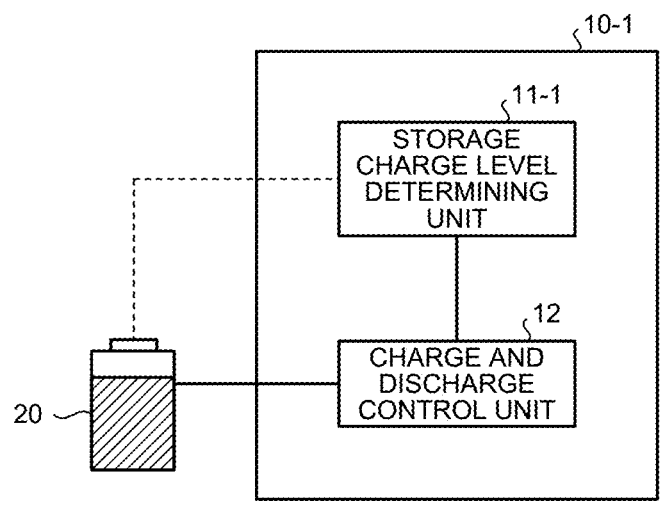
FIG. 1 is a diagram illustrating a configuration of a charge and discharge control device according to a first embodiment of the present invention.

A charge and discharge control device and a charge and discharge control method according to certain embodiments of the present invention will be described in detail below with reference to the drawings. Note that the present invention is not limited to the embodiments.

In the description below and in the drawings, the same components or components having similar functions will be represented by the same reference numerals. In addition, the drawings are illustrated in a simplified manner, and the dimensions and the shapes of the illustration are not necessarily accurate.

First Embodiment

FIG. 1 is a diagram illustrating a configuration of a charge and discharge control device 10-1 according to a first embodiment of the present invention. The charge and discharge control device 10-1 can be connected with a battery 20, and controls charge and discharge of the connected battery 20.

The battery 20 is a chargeable and dischargeable secondary battery. While an example in which the battery 20 is a lithium-ion battery will be described below, the kind of the battery 20 is not limited to a lithium-ion secondary battery, and may be a lead storage battery, a nickel metal hydride battery, or the like. Furthermore, the shape of the battery is not limited to the illustrated example, and the technologies described in the present embodiment are applicable to batteries of various shapes such as a stacked type, a wound type, a button type, and the like.

Secondary batteries such as lithium-ion batteries are known to degrade even in an unused state, that is, in a state in which the batteries are not charged and discharged. The degradation is called storage degradation. In addition, in the following description, the state in which charge and discharge are not performed and in which the battery 20 is not used will be referred to as a stored state. When the battery 20 is in the stored state, an active material therein undergoes oxidation-reduction reaction and the battery 20 discharges little by little even while no current flows through an external circuit. The discharged charge undergoes a reversible process in which the charge can be returned by charging or an irreversible process in which the charge is not recovered, which leads to deterioration. The rate of storage degradation changes depending on the charge level and the influence of temperature. The charge level is also called a state of charge (SOC).

As the degradation of the battery 20 progresses, chargeable energy capacity lowers, and the maximum power that can be supplied is lowered. In addition, as the battery 20 repeats the charge and discharge cycle, the electrodes expand and contract, and such a degradation phenomenon as peeling off of an electrode material is caused by fatigue failure. Such degradation due to charge and discharge is called cycle degradation. The rate of cycle degradation changes depending on the influence of the current values at charge and discharge, temperature, the ranges of charge level cycled therethrough, and the like.

The rate of degradation of the battery 20 also varies depending on the electrode material. For example, a lithium-ion battery in which a manganese material such as $LiMn_2O_4$, which is a material containing manganese, a mixed material of a nickel material such as $LiNiO_2$ and a manganese material, a mixed material of a ternary material such as $Li(Ni-Mn-Co)O_2$ and a manganese material, or the like, for example, is used for a positive electrode material, is likely to degrade faster in a middle range of charge level. A lithium-ion battery in which a manganese material is used has a characteristic of being likely to deteriorate faster in a second charge level range, which is a middle charge level range higher than a first charge level range, in which the charge level is close to zero, and lower than a third charge level range, in which the charge level is close to an upper limit. This is because a distortion in a spinel structure called a Jahn-Teller effect occurs in the second charge level range and degradation is thus likely to progress with elution of manganese. Note that batteries having the characteristics of being likely to deteriorate faster in the second charge level range are not limited to those in which a manganese material is used.

Figure 2:
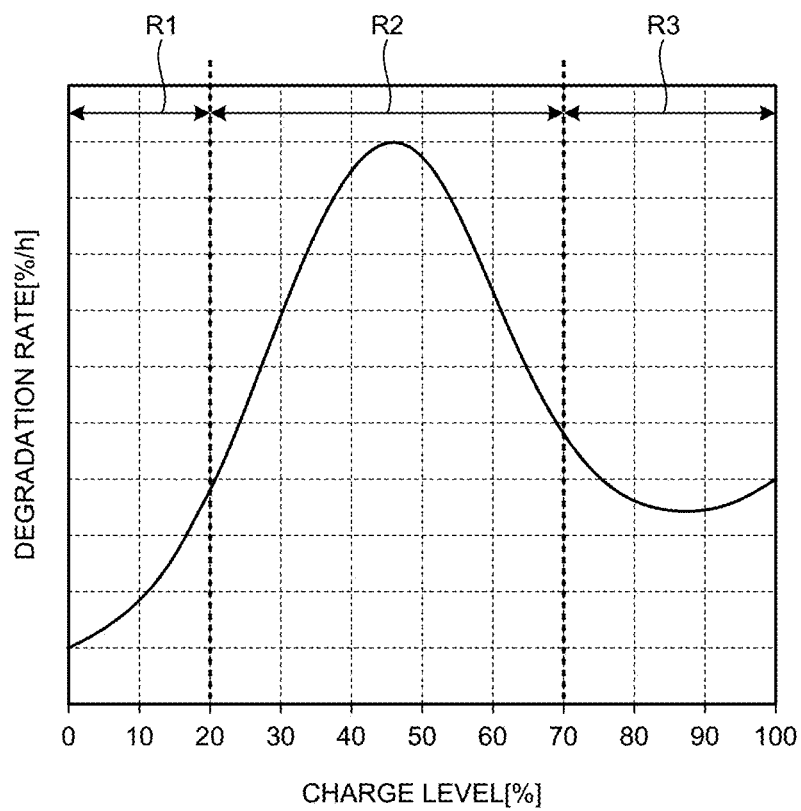
FIG. 2 is a graph illustrating the relation between a charge level of a battery illustrated in FIG. 1 and a degradation rate when the battery is stored at the charge level.

FIG. 2 is a graph illustrating the relation between a charge level of the battery 20 illustrated in FIG. 1 and a degradation rate when the battery 20 is stored at the charge level. The range of the charge level of the battery 20 can be divided into three ranges, which are a first charge level range R1, a second charge level range R2, and a third charge level range R3. The range is divided on the basis of the magnitude of storage degradation. The second charge level range R2 is a range including the maximum value of storage degradation, which is degradation of the battery 20 over time. The first charge level range R1 is a range of charge level smaller than the second charge level range R2. The third charge level range R3 is a range of charge level larger than the second charge level range R2. Herein the magnitude of the storage degradation is expressed by the rate of degradation per hour.

In the example illustrated in FIG. 2, the first charge level range R1 is a range of charge level between 0% and 20%, the second charge level range R2 is a range of charge level between 20% and 70%, and the third charge level range R3 is a range of charge level between 70% and 100%. The degradation rate in the second charge level range R2 is higher than those in the first charge level range R1 and the third charge level range R3. In the example illustrated in FIG. 2, the degradation rate in the third charge level range R3 is higher than that in the first charge level range R1.

As illustrated in FIG. 2, the battery 20 has a characteristic of high storage degradation in the second charge level range R2. The charge and discharge control device 10-1 therefore controls charge and discharge of the battery 20 so that the charge level when the battery 20 is stored is included in the first charge level range R1 or the third charge level range R3.

The charge and discharge control device 10-1 includes a storage charge level determining unit 11-1 that determines the charge level at storage during which the battery 20 is not charged and discharged, and a charge and discharge control unit 12 that controls charge and discharge of the battery 20 on the basis of the determined charge level at storage.

The storage charge level determining unit 11-1 selects one range from the first charge level range R1 and the third charge level range R3. The first charge level range R1 is lower than the second charge level range R2, which is a range of charge level including the maximum value of the storage degradation ratio, which is the degradation ratio of the battery 20 over time. The third charge level range R3 is higher than the second charge level range R2. The storage charge level determining unit 11-1 determines, within the selected range, the charge level at storage during which the battery 20 is not charged and discharged. Note that the storage charge level determining unit 11-1 can use ranges preset on the basis of the magnitude of storage degradation.

The storage charge level determining unit 11-1 can randomly select the first charge level range R1 or the third charge level range R3, for example. In addition, the storage charge level determining unit 11-1 may determine the charge level at storage on the basis of the current charge level of the battery 20. For example, when the current charge level is included in the second charge level range R2, the storage charge level determining unit 11-1 randomly selects one from the first charge level range R1 and the third charge level range R3. In this process, when the current charge level is included in the first charge level range R1 or the third charge level range R3, the storage charge level determining unit 11-1 can select the range in which the current charge level is included.

Alternatively, the storage charge level determining unit 11-1 can also determine the charge level at storage on the basis of the storage time and the charging time, which is the time required for charging from the current charge level to a target charge value. For example, the storage charge level determining unit 11-1 may select the first charge level range R1 when the storage time is longer than the charging time, and the storage charge level determining unit 11-1 may select the third charge level range R3 when the storage time is equal to or shorter than the charging time.

The charge and discharge control unit 12 controls charge and discharge of the battery 20 on the basis of the charge level at storage which is determined by the storage charge level determining unit 11-1. When the determined charge level at storage is higher than the current charge level, the charge and discharge control unit 12 charges the battery 20 to the charge level at storage. When the determined charge level at storage is lower than the current charge level, the charge and discharge control unit 12 discharges the battery 20 to the charge level at storage.

The battery 20 is installed on a vehicle such as an electric vehicle (EV) or a plug-in hybrid electric vehicle (PHEV). EVs, PHEVs, and the like may travel tens of thousands of km per year depending on users, but it is known that many users travel distances of about ten thousand km per year. In the case of a travel distance of about ten thousand km per year, the characteristic is that the parking time during which the vehicle is not traveling is normally longer than the time during which the vehicle is traveling. Thus, in the case of a battery installed on a vehicle such as an EV and a PHEV, the storage time during which the battery is stored at a predetermined charge level is long, and the degradation thereof becomes faster depending on the temperature and the charge level at storage.

In a case where a converter for an in-vehicle battery charger or the like that bidirectionally delivers power is installed on a vehicle such as an EV or a PHEV, power in the battery 20 can be used for electrical appliances in a house, can be directly connected with and used for outdoor electrical appliances in addition to those in a house, and can be used in a case of power failure at the time of disaster. Alternatively, in the future, various use cases are expected such as a case where a plurality of vehicles such as EVs and PHEVs are connected with each other to deliver power for power interchange. In a case where a converter in a vehicle does not support bidirectional power delivery, charging is typically performed to full charge when the converter is connected with an in-home or public charging station. In contrast, in a case where bidirectional power delivery is supported, power stored in the battery 20 can be used for electrical appliances and the like in a house while degradation of the battery 20 is reduced by adjustment of the charge level.

Figure 3:
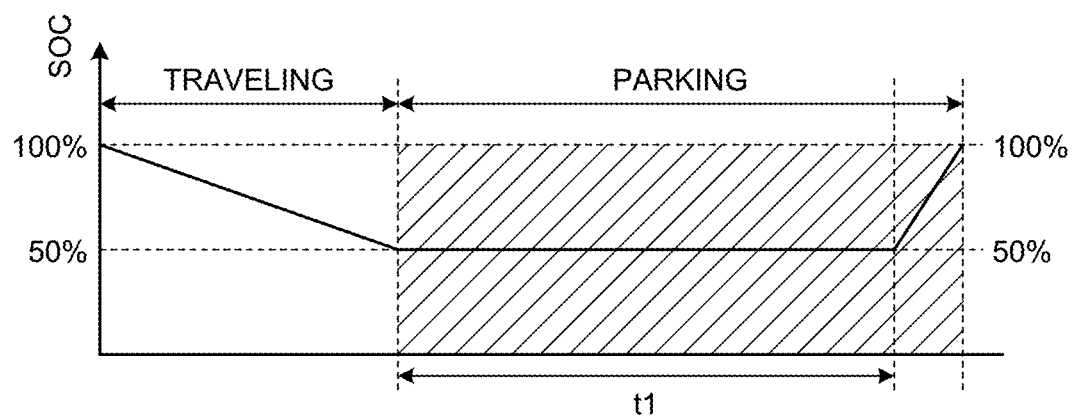
FIG. 3 is a graph illustrating a first example of control of the charge level of the battery illustrated in FIG. 1.

FIG. 3 is a graph illustrating a first example of control of the charge level of the battery 20 illustrated in FIG. 1. The charge level at a point when the vehicle on which the battery 20 is installed is started to travel is 100%, and the charge level at a point when the vehicle finishes traveling and is parked is 50%. In the first example, the battery 20 is stored for a time t1 without adjustment of the charge level at storage, and then charged to 100%, which is the upper limit. Thus, the charge level at storage is 50%. The time t1 is a value obtained by subtracting the charging time required to charge the battery 20 from the charge level of 50% to 100% from the parking time.

Figure 4:
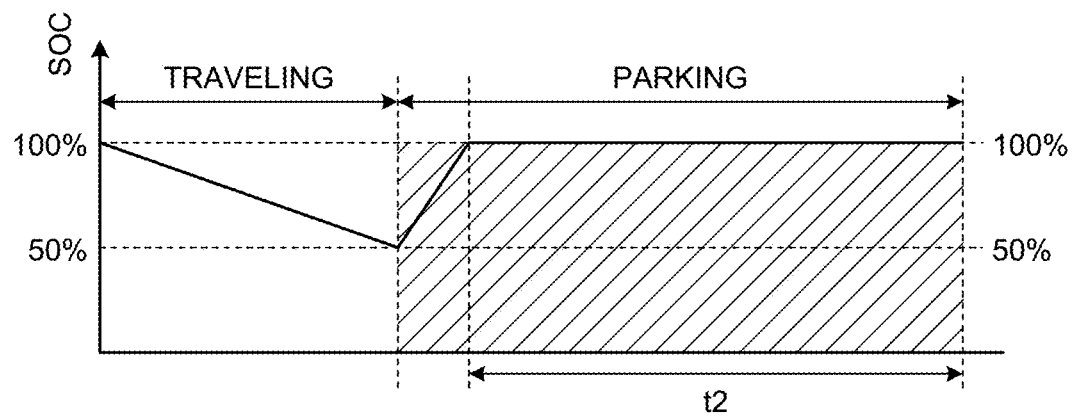
FIG. 4 is a graph illustrating a second example of control of the charge level of the battery illustrated in FIG. 1.

FIG. 4 is a graph illustrating a second example of control of the charge level of the battery 20 illustrated in FIG. 1. The charge level at a point when the vehicle on which the battery 20 is installed is started to travel is 100%, and the charge level at a point when the vehicle finishes traveling and is parked is 50%. In the second example, the charge level at storage is 100%. Thus, the charge and discharge control device 10-1 starts charging the battery 20 at a point when parking is started to increase the charge level from 50% to 100%. During a storage time for a time t2 from the end of charging until the next time the vehicle starts to travel, the battery 20 is stored at the charge level of 100%.

Figure 5:
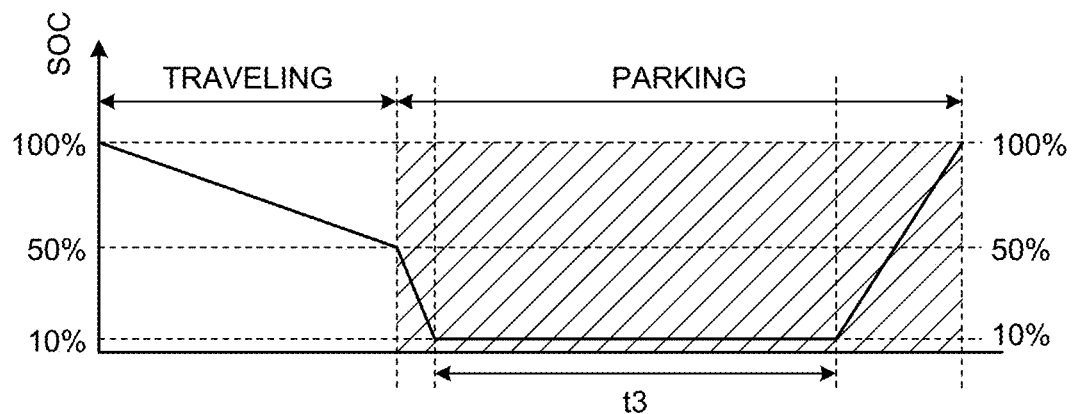
FIG. 5 is a graph illustrating a third example of control of the charge level of the battery illustrated in FIG. 1.

FIG. 5 is a graph illustrating a third example of control of the charge level of the battery 20 illustrated in FIG. 1. The charge level at a point when the vehicle on which the battery 20 is installed is started to travel is 100%, and the charge level at a point when the vehicle finishes traveling and is parked is 50%. In the third example, the charge level at storage is 10%. Thus, the charge and discharge control device 10-1 starts discharging the battery 20 at a point when parking is started to decrease the charge level from 50% to 10%. For a time t3 from the end of discharging, the battery 20 is stored at the charge level of 10%. After the time t3 and until the next time the vehicle starts to travel, the charge and discharge control device 10-1 charges the battery 20 to the charge level of 100%. The time t3 is a value obtained by subtracting the charging time required to charge the battery 20 from the charge level of 10% to 100% from the time between a point when the charge and discharge control device 10-1 has finished discharging the battery 20 and a point that is the next time the vehicle starts traveling.

Figure 6:
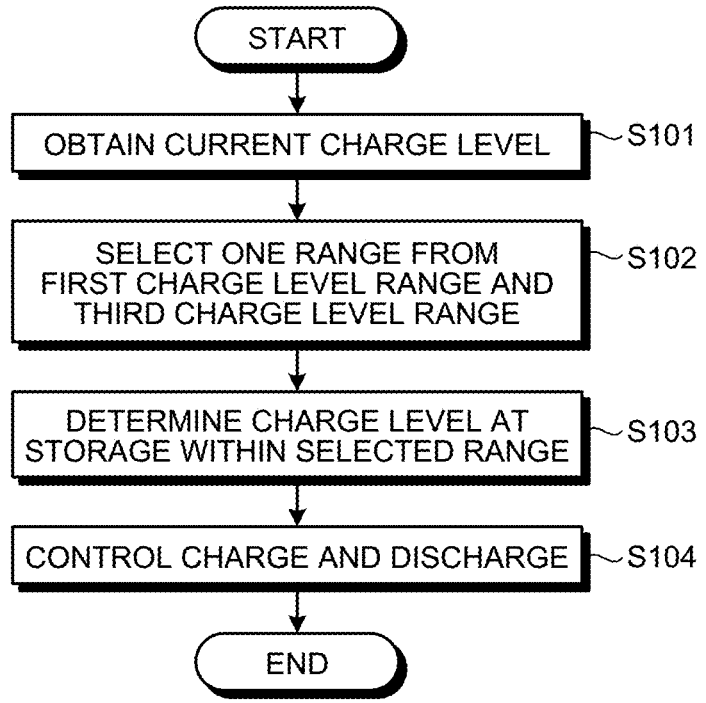
FIG. 6 is a flowchart illustrating a first example of the operation of the charge and discharge control device illustrated in FIG. 1.

FIG. 6 is a flowchart illustrating a first example of the operation of the charge and discharge control device 10-1 illustrated in FIG. 1. The storage charge level determining unit 11-1 obtains the current charge level of the battery 20 (step S101). The storage charge level determining unit 11-1 selects one range from the first charge level range R1 and the third charge level range R3 (step S102). For example, the storage charge level determining unit 11-1 can randomly select the first charge level range R1 or the third charge level range R3. Alternatively, the storage charge level determining unit 11-1 can select a range closer to the current charge level from the first charge level range R1 and the third charge level range R3.

The storage charge level determining unit 11-1 determines, within the selected range, the charge level at storage (step S103). For example, in the example illustrated in FIG. 2, because the first charge level range R1 is between 0% and 20%, the storage charge level determining unit 11-1 determines the charge level at storage to be a value equal to or higher than 0% and lower than 20% when the first charge level range R1 is selected. In the example illustrated in FIG. 2, because the third charge level range R3 is between 70% and 100%, the storage charge level determining unit 11-1 determines the charge level at storage to be a value equal to or higher than 70% and equal to or lower than 100% when the third charge level range R3 is selected.

The charge and discharge control unit 12 performs charge and discharge control of the battery 20 by using the determined value of the charge level at storage (step S104). For example, when the charge level at storage is lower than the current charge level obtained in step S101, the charge and discharge control unit 12 discharges the battery 20 until the charge level of the battery 20 reaches the charge level at storage. For example, when the charge level at storage is higher than the current charge level obtained in step S101, the charge and discharge control unit 12 charges the battery 20 until the charge level of the battery 20 reaches the charge level at storage. Furthermore, when the charge level at storage is lower than the upper limit of the charge level, the charge and discharge control unit 12 can charge the battery 20 to the upper limit before the battery 20 is used next. Meanwhile, because the charge level at storage is determined so that the storage degradation will be small, the degradation of the battery 20 can be more reduced as the stored state is longer. Thus, the charge and discharge control unit 12 calculates the charging time required for charging from the charge level at storage to the upper limit, and starts charging at a time point that is the charging time before the time point when the battery 20 is started to be used next.

Figure 7:
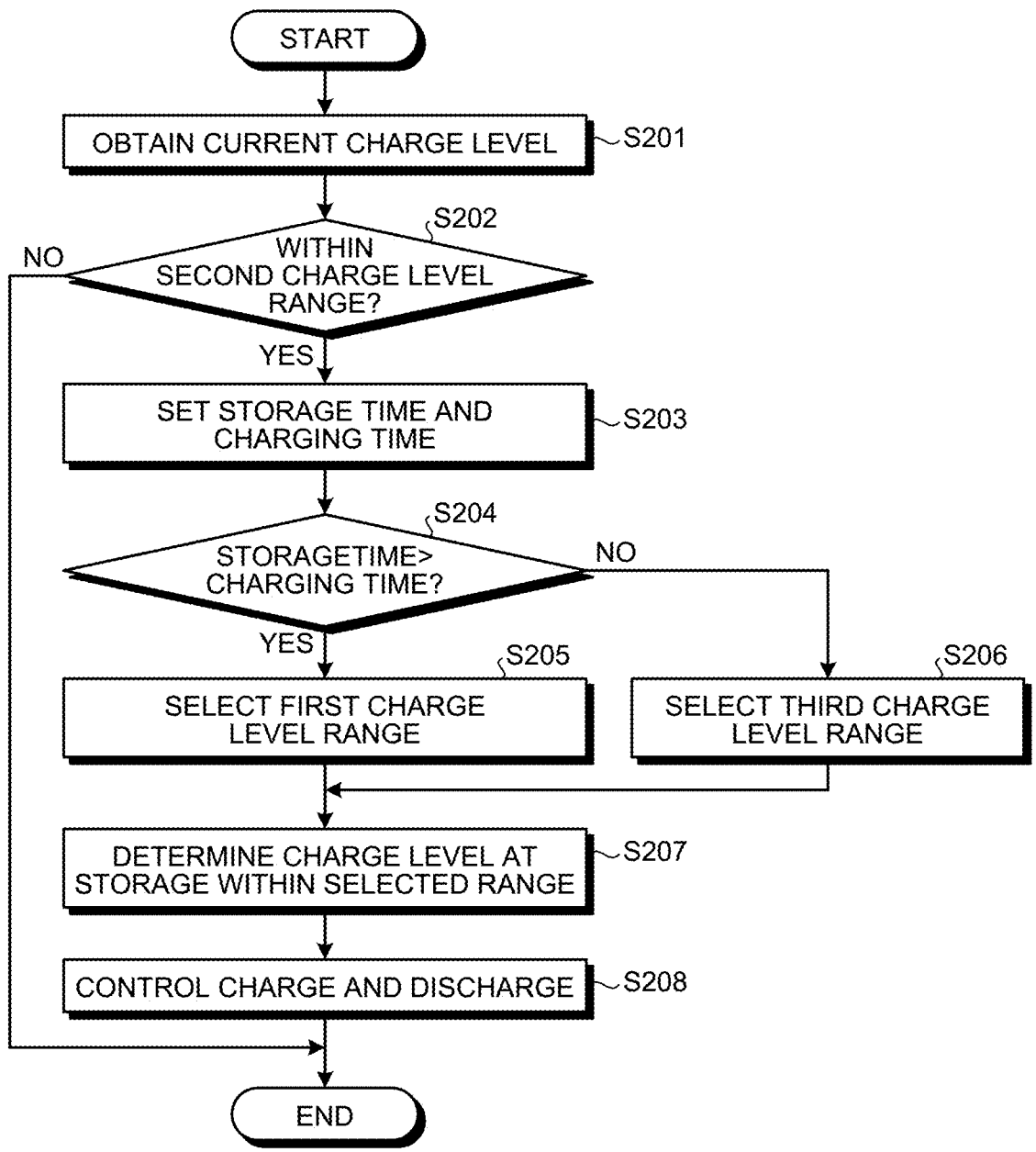
FIG. 7 is a flowchart illustrating a second example of the operation of the charge and discharge control device illustrated in FIG. 1.

FIG. 7 is a flowchart illustrating a second example of the operation of the charge and discharge control device 10-1 illustrated in FIG. 1. The storage charge level determining unit 11-1 obtains the current charge level of the battery 20 (step S201). The storage charge level determining unit 11-1 determines whether or not the obtained current charge level is a value within the second charge level range R2 (step S202).

If the obtained current charge level is a value within the second charge level range R2 (step S202: Yes), the storage charge level determining unit 11-1 sets the storage time and the charging time (step S203). The storage time is a time until the battery 20 will be started to be used next, and the charging time is a time required for charging from the current charge level to the upper limit of the charge level. The storage charge level determining unit 11-1 compares the length of the storage time with that of the charging time, and determines whether or not the storage time is longer than the charging time (step S204).

If the storage time is longer than the charging time (step S204: Yes), the storage charge level determining unit 11-1 selects the first charge level range R1 (step S205). If the storage time is equal to or shorter than the charging time (step S204: No), the storage charge level determining unit 11-1 selects the third charge level range R3 (step S206).

The storage charge level determining unit 11-1 determines, within the selected range, the charge level at storage (step S207). The charge and discharge control unit 12 performs charge and discharge control of the battery 20 by using the determined value of the charge level at storage (step S208). Note that the specific method for determining the charge level at storage is similar to that in step S103 in FIG. 6, and that the specific method of charge and discharge control is similar to that in step S104 in FIG. 6, detailed description of which will thus not be repeated here.

If the current charge level is not a value within the second charge level range R2 (step S202; No), the processes in steps S203 to S208 are omitted. Specifically, if the current charge level is a value within the first charge level range R1 or the third charge level range R3, the charge level at storage is not adjusted, and the battery 20 is stored at the current charge level. Note that, in this case as well, the charge and discharge control unit 12 may charge the battery 20 to the upper limit before the battery 20 is started to be used next. The time point at which this charging control is started is calculated on the basis of the time until the battery 20 will be started to be used next and the charging time required for charging from the current charge level to the upper limit.

In the second example, the charge level at storage is adjusted only when the current charge level is a value within the second charge level range R2. As a result, when the current charge level is a value included in the first charge level range R1 or the third charge level range R3, there is no cycle degradation caused by charge and discharge for adjusting the charge level at storage. Thus, when the difference between the storage degradation rate in the first charge level range R1 and the storage degradation rate in the third charge level range R3 is smaller than the cycle degradation ratio, the degradation of the battery 20 can be reduced.

In addition, in the second example, the first charge level range R1 is selected when the storage time is longer than the charging time, or the third charge level range R3 is selected when the storage time is equal to or shorter than the charging time. When the charge level at storage is in the first charge level range R1, the charging time until the start of the next use is likely to be long. As a result of selecting the range of the charge level at storage on the basis of the storage time and the charging time, the first charge level range R1 is not selected when a sufficient time for charging the battery 20 is not available before the battery 20 starts to be used next. Consequently, the situation interfering with the use of the battery 20 can be avoided.

As described above, the charge and discharge control device 10-1 according to the first embodiment of the present invention selects one range from the first charge level range R1 and the third charge level range R3, and determines the charge level at storage within the selected range. As a result, the charge level at storage of the battery 20 is included in the first charge level range R1 lower than the second charge level range R2, which is a range of charge level including the maximum value of the storage degradation, which is degradation of the battery over time, or the third charge level range R3 higher than the second charge level range R2. This enables reduction in storage degradation of the battery 20 that experiences fast storage degradation in the second charge level range R2, which is a middle range of the charge level.

Second Embodiment

Figure 8:
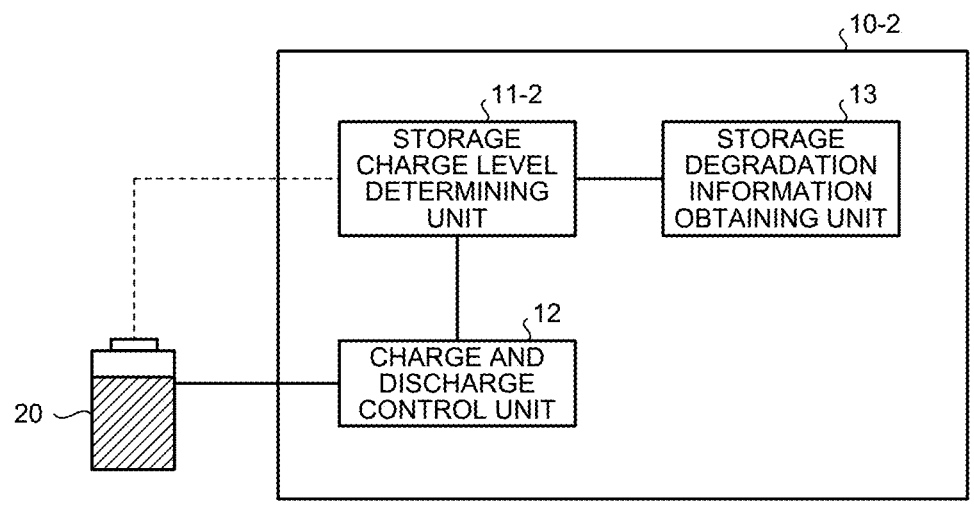
FIG. 8 is a diagram illustrating a functional configuration of a charge and discharge control device according to a second embodiment of the present invention.

FIG. 8 is a diagram illustrating a functional configuration of a charge and discharge control device 10-2 according to a second embodiment of the present invention. The charge and discharge control device 10-2 includes a storage charge level determining unit 11-2, the charge and discharge control unit 12, and a storage degradation information obtaining unit 13.

The storage degradation information obtaining unit 13 obtains storage degradation information indicating the magnitude of the storage degradation of the battery 20. The storage degradation information obtaining unit 13 can obtain the storage degradation information on the basis of the charge level of the battery 20. Alternatively, the storage degradation information obtaining unit 13 may obtain the storage degradation information on the basis of the charge level of the battery 20 and temperature.

Figure 9:
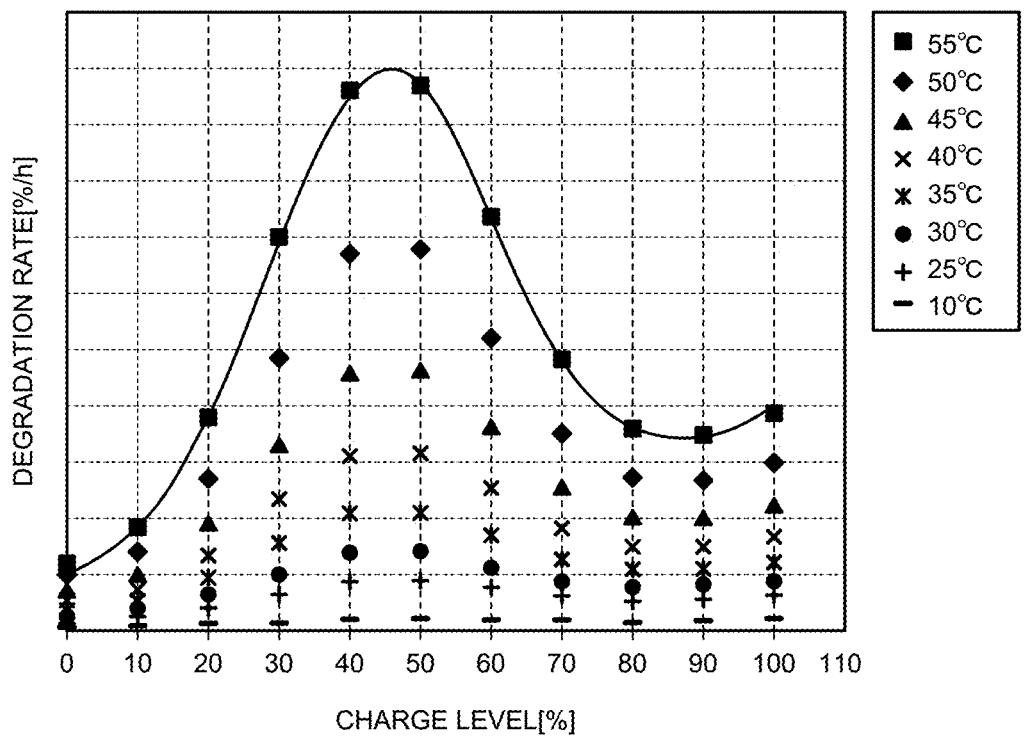
FIG. 9 is a graph illustrating the relation between the charge level and the degradation rate of a battery illustrated in FIG. 8.

FIG. 9 is a graph illustrating the relation between the charge level and the degradation rate of the battery 20 illustrated in FIG. 8. FIG. 9 illustrates that the battery 20 has the maximum value of the degradation rate in the middle charge level range, the degradation rate is relatively high in the high charge level range, and the degradation rate is smaller in the low charge level range than in the middle charge level range and the high charge level range. The degradation rate is a rate of decrease in measured capacity per predetermined time obtained by assuming that the capacity of the battery 20 defined as being in a brand-new state or an initial state is 100% and measuring the capacity at timings when predetermined times have elapsed. While the capacity is expressed in % in FIG. 9, the unit in which the capacity is expressed may be Ah or Wh. In addition, the degradation rate is not limited to the decrease rate per hour, and may be the rate of decrease in capacity per minute (Ah/min), or a degradation rate per second (Ah/sec). In addition, a degradation rate associated with a given temperature and a charge level between measurement points may be estimated through linear interpolation or the like from a correlation graph as illustrated in FIG. 9.

Figure 10:
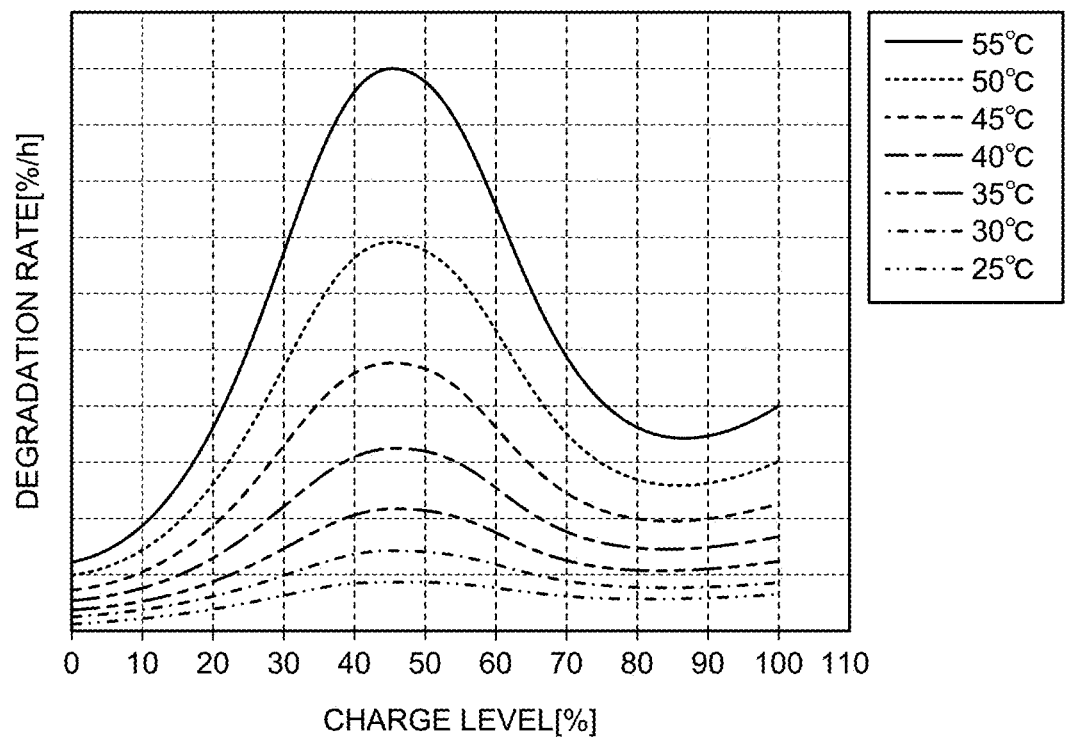
FIG. 10 is a graph illustrating functions approximating the relation between the charge level and the degradation rate of the battery illustrated in FIG. 8.

FIG. 10 is a graph illustrating functions approximating the relation between the charge level and the degradation rate of the battery 20 illustrated in FIG. 8. As illustrated in FIGS. 9 and 10, the degradation rate of the battery 20 varies depending on the charge level and the temperature. Thus, the storage degradation information obtaining unit 13 can obtain the storage degradation information on the basis of the charge level and the temperature. The storage degradation information may be information indicating the storage degradation ratio. Alternatively, the storage degradation information obtaining unit 13 may obtain the storage degradation information on the basis of the charge level, the temperature, and the storage time of the battery 20. In this case, the storage degradation information is expressed by a storage degradation amount obtained by integrating the storage degradation ratio with respect to the storage time. When the temperature and the charge level change with time, the storage degradation information obtaining unit 13 can calculate the storage degradation amount by adding the storage degradation ratios obtained from the charge levels and the temperatures at respective time points.

The description refers back to FIG. 8. The storage charge level determining unit 11-2 has a function of determining the charge level at storage on the basis of the storage degradation information obtained by the storage degradation information obtaining unit 13 in addition to the functions of the storage charge level determining unit 11-1.

Figure 11:
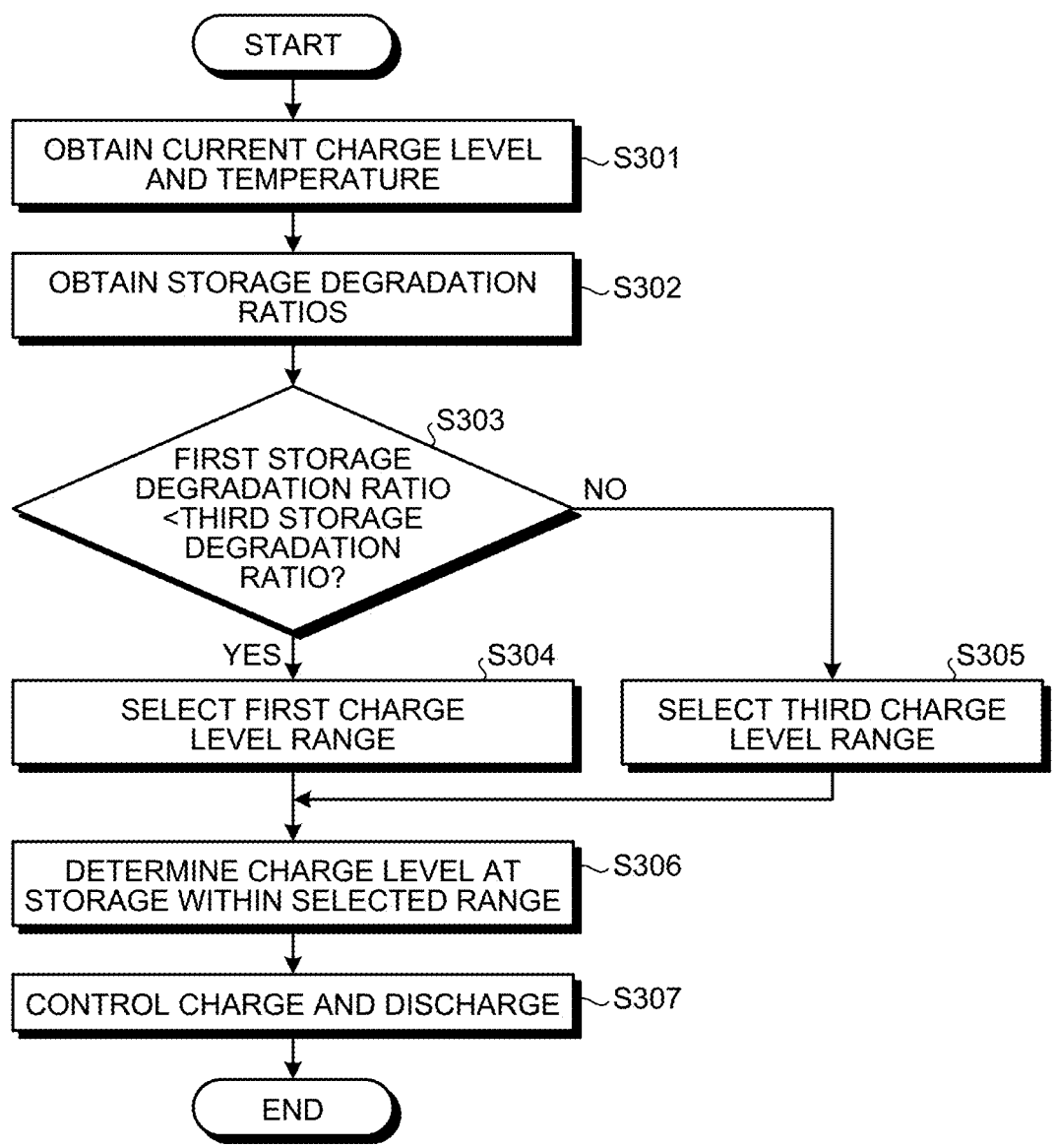
FIG. 11 is a flowchart illustrating a first example of the operation of the charge and discharge control device illustrated in FIG. 8.

FIG. 11 is a flowchart illustrating a first example of the operation of the charge and discharge control device 10-2 illustrated in FIG. 8. The storage charge level determining unit 11-2 obtains the current charge level and the temperature of the battery 20 (step S301).

The storage charge level determining unit 11-2 outputs the obtained temperature to the storage degradation information obtaining unit 13 to cause the storage degradation information obtaining unit 13 to obtain the storage degradation ratio (step S302). Specifically, the storage degradation information obtaining unit 13 obtains a first storage degradation ratio, which is a storage degradation ratio when the battery 20 is stored at a charge level included in the first charge level range R1, and a third storage degradation ratio, which is a storage degradation ratio when the battery 20 is stored at a charge level included in the third charge level range R3. The storage degradation information obtaining unit 13 outputs the obtained storage degradation ratio, which is the storage degradation information, to the storage charge level determining unit 11-2.

The storage charge level determining unit 11-2 compares the magnitude of the first storage degradation ratio with that of the third storage degradation ratio to determine whether or not the first storage degradation ratio is smaller than the third storage degradation ratio (step S303).

If the first storage degradation ratio is smaller than the third storage degradation ratio (step S303: Yes), the storage charge level determining unit 11-2 selects the first charge level range R1 (step S304). If the first storage degradation ratio is equal to or larger than the third storage degradation ratio (step S303: No), the storage charge level determining unit 11-2 selects the third charge level range R3 (step S305).

The storage charge level determining unit 11-2 determines, within the selected range, the charge level at storage (step S306). The charge and discharge control unit 12 performs charge and discharge control of the battery 20 by using the determined value of the charge level at storage (step S307).

Note that the specific method for determining the charge level at storage is similar to that in step S103 in FIG. 6, and that the specific method of charge and discharge control is similar to that in step S104 in FIG. 6, detailed description of which will thus not be repeated here.

In the first example of the second embodiment of the present invention, the storage degradation ratios are directly compared with each other, and the charge level at storage is thus determined. In the first embodiment, the charge level at storage is a value included in the first charge level range R1 or the third charge level range R3 on the assumption that the storage degradation is smaller in the first charge level range R1 and the third charge level range R3 than in the second charge level range R2. In the present embodiment, the first storage degradation ratio in the first charge level range R1 and the third storage degradation ratio in the third charge level range R3 are further compared directly with each other, and the charge level at storage is selected so that the storage degradation is smaller. As a result, the storage degradation can further be made smaller.

Figure 12:
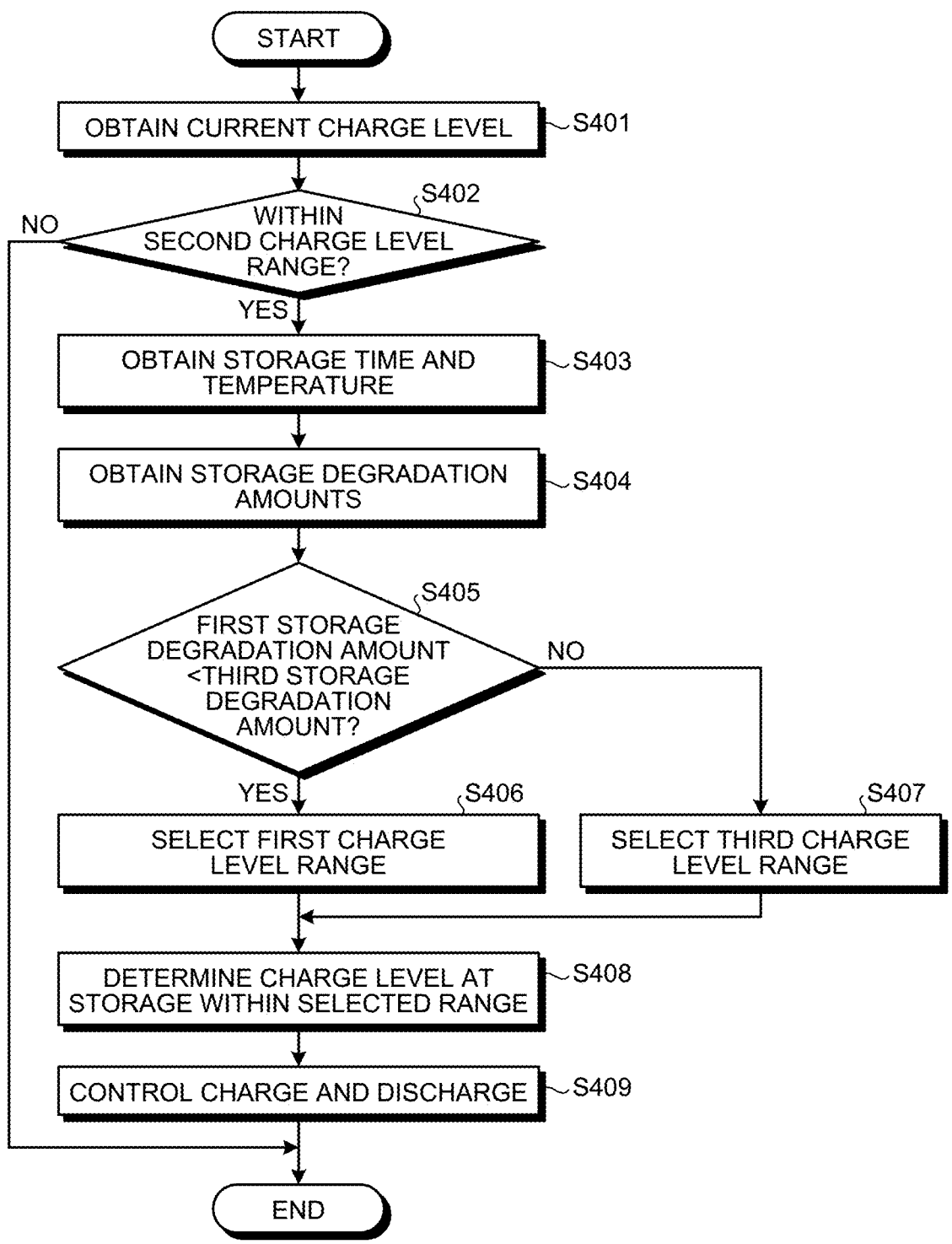
FIG. 12 is a flowchart illustrating a second example of the operation of the charge and discharge control device illustrated in FIG. 8.

FIG. 12 is a flowchart illustrating a second example of the operation of the charge and discharge control device 10-2 illustrated in FIG. 8. The storage charge level determining unit 11-2 obtains the current charge level of the battery 20 (step S401).

The storage charge level determining unit 11-2 determines whether or not the obtained current charge level is a value within the second charge level range R2 (step S402). If the current charge level is included in the second charge level range R2 (step S402: Yes), the storage charge level determining unit 11-2 obtains the storage time and the temperature (step S403).

The storage charge level determining unit 11-2 causes the storage degradation information obtaining unit 13 to obtain storage degradation amounts on the basis of the charge level, the storage time, and the temperature (step S404). Specifically, the storage degradation information obtaining unit 13 obtains a first storage degradation amount, which is a storage degradation amount when the battery 20 is stored at a charge level included in the first charge level range R1 for the storage time, and a third storage degradation amount, which is a storage degradation amount when the battery 20 is stored at a charge level included in the third charge level range R3 for the storage time. The storage degradation information obtaining unit 13 outputs the obtained storage degradation amount, which is the storage degradation information, to the storage charge level determining unit 11-2.

The storage charge level determining unit 11-2 compares the magnitude of the first storage degradation amount with that of the third storage degradation amount to determine whether or not the first storage degradation amount is smaller than the third storage degradation amount (step S405).

If the first storage degradation amount is smaller than the third storage degradation amount (step S405: Yes), the storage charge level determining unit 11-2 selects the first charge level range R1 (step S406). If the first storage degradation amount is equal to or larger than the third storage degradation amount (step S405: No), the storage charge level determining unit 11-2 selects the third charge level range R3 (step S407).

The storage charge level determining unit 11-2 determines, within the selected range, the charge level at storage (step S408). The charge and discharge control unit 12 performs charge and discharge control of the battery 20 by using the determined value of the charge level at storage (step S409).

Note that the specific method for determining the charge level at storage is similar to that in step S103 in FIG. 6, and that the specific method of charge and discharge control is similar to that in step S104 in FIG. 6, detailed description of which will thus not be repeated here.

In the second example, the storage degradation information is a storage degradation amount based on the storage time. In the case where the charge level at storage is a value in the first charge level range R1 and in the case where the charge level at storage is a value in the third charge level range R3, the times required for charging to the upper limit at the end of storage differ from each other, and the storage times therefore differ from each other. According to the second example, the charge level at storage can be determined in view of the influence of the difference in the storage time on the magnitude of storage degradation, which enables further reduction in the storage degradation.

Third Embodiment

Figure 13:
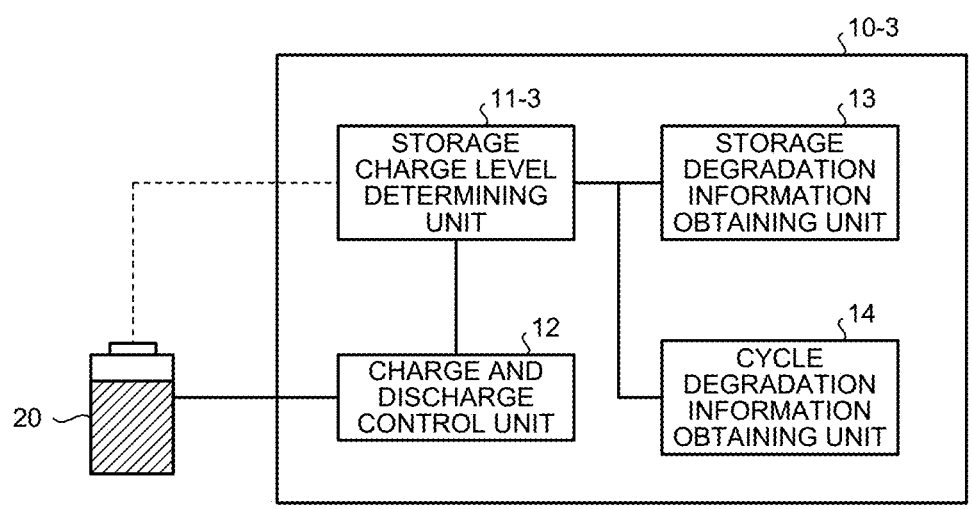
FIG. 13 is a diagram illustrating a functional configuration of a charge and discharge control device according to a third embodiment of the present invention.

FIG. 13 is a diagram illustrating a functional configuration of a charge and discharge control device 10-3 according to a third embodiment of the present invention. The charge and discharge control device 10-3 includes a storage charge level determining unit 11-3, the charge and discharge control unit 12, the storage degradation information obtaining unit 13, and a cycle degradation information obtaining unit 14.

The cycle degradation information obtaining unit 14 obtains cycle degradation information indicating the magnitude of the degradation of the battery 20 caused by charge and discharge. The cycle degradation information obtaining unit 14 can obtain the cycle degradation information on the basis of the temperature during charging and discharging, the electrical current value, and a cycle charge level range, which is a cycle range of the charge level. The cycle degradation information obtaining unit 14 outputs the obtained cycle degradation information to the storage charge level determining unit 11-3.

Figure 14:
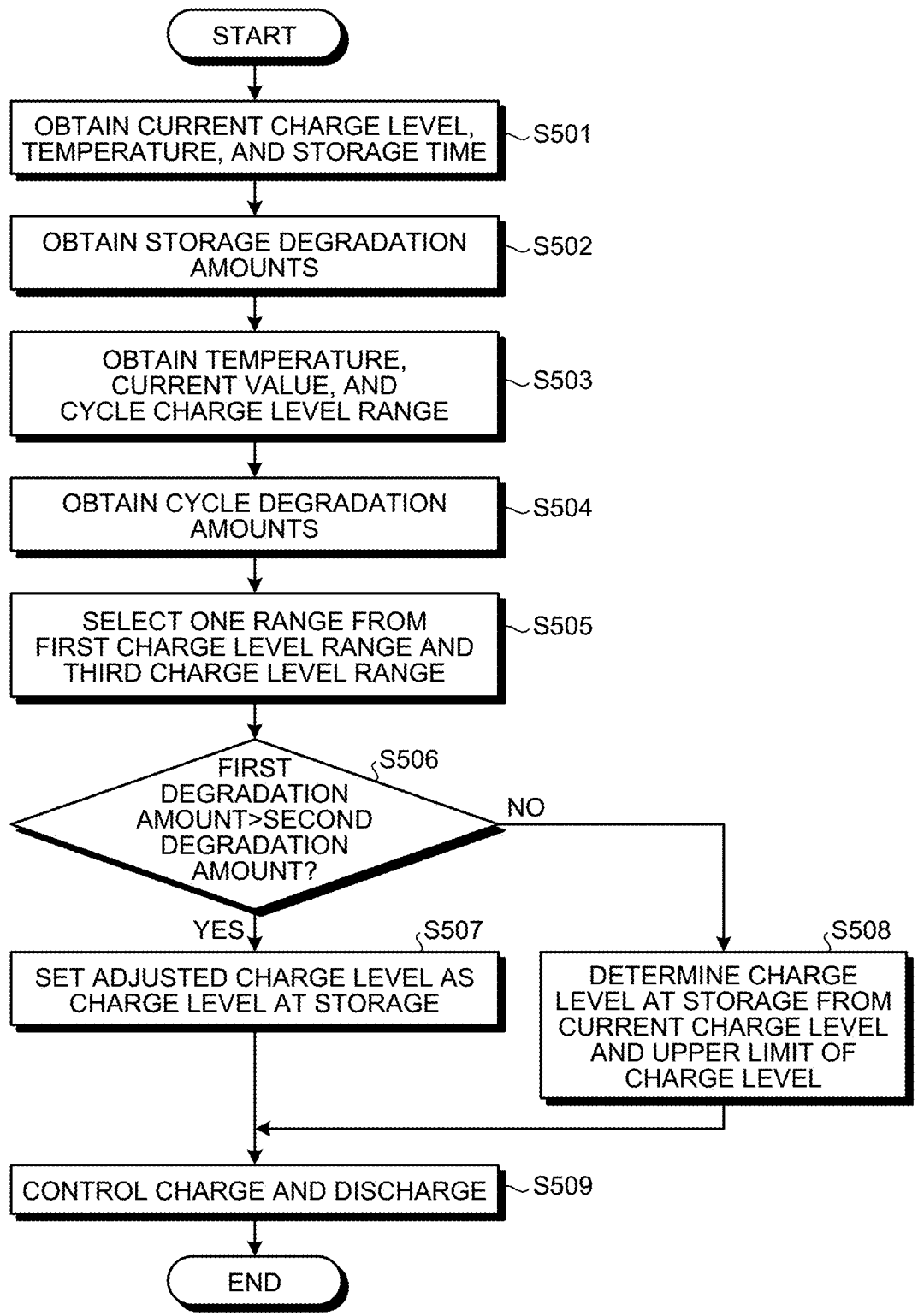
FIG. 14 is a flowchart illustrating the operation of the charge and discharge control device illustrated in FIG. 13.

FIG. 14 is a flowchart illustrating the operation of the charge and discharge control device 10-3 illustrated in FIG. 13. The storage charge level determining unit 11-3 obtains the current charge level, the temperature, and the storage time of the battery 20 (step S501). The storage charge level determining unit 11-3 causes the storage degradation information obtaining unit 13 to obtain storage degradation amounts on the basis of the charge level, the temperature, and the storage time (step S502).

Specifically, the storage degradation information obtaining unit 13 obtains a storage degradation amount in the case of storage at the current charge level, a storage degradation amount in a case where the charge level at storage is a value in the first charge level range R1, and a storage degradation amount in a case where the charge level at storage is a value in the third charge level range R3.

The storage charge level determining unit 11-3 obtains the temperature, the electrical current value, and the cycle charge level range of the battery 20 during charging and discharging (step S503). The storage charge level determining unit 11-3 causes the cycle degradation information obtaining unit 14 to obtain cycle degradation amounts on the basis of the temperature, the electrical current value, and the cycle charge level range (step S504). Specifically, the cycle degradation information obtaining unit 14 obtains a cycle degradation amount in the case where the charge level at storage is a value in the first charge level range R1, and a cycle degradation amount in the case where the charge level at storage is a value in the third charge level range R3. The cycle degradation information obtaining unit 14 outputs the obtained cycle degradation amounts to the storage charge level determining unit 11-3.

The storage charge level determining unit 11-3 selects one range from the first charge level range R1 and the third charge level range R3 on the basis of the storage degradation amount and the cycle degradation amount (step S505). For example, the storage charge level determining unit 11-3 can compare a sum of the storage degradation amount and the cycle degradation amount when the storage charge level is a value in the first charge level range R1, with a sum of the storage degradation amount and the cycle degradation amount in the case where the storage charge level is a value in the third charge level range R3, and selects a range with a smaller degradation amount.

The storage charge level determining unit 11-3 compares a first degradation amount, which is a storage degradation amount in the case of storage at the current charge level with a second degradation amount, which is the sum of the storage degradation amount and the cycle degradation amount in the case where the charge level at storage is adjusted to a value within the range selected in step S505, to determine whether or not the first degradation amount is larger than the second degradation amount (step S506).

If the first degradation amount is larger than the second degradation amount (step S506: Yes), the storage charge level determining unit 11-3 sets the adjusted charge level as the charge level at storage (step S507). In other words, the storage charge level determining unit 11-3 adjusts the charge level at storage to a value within the range selected in step S505.

If the first degradation amount is equal to or smaller than the second degradation amount (step S506: No), the storage charge level determining unit 11-3 determines the charge level at storage among the current charge level and the upper limit of the charge level (step S508). Whether the charge level at storage is to be the current charge level or the upper limit of the charge level can be determined on the basis of the degradation amount with each of the charge levels. Alternatively, the degradation ratio in the case of storage after charging to a charge level of 100%, which is the upper limit, may be referred to as a reference degradation ratio, and the charge level at storage may be determined so that the difference between the storage degradation ratio in the case of storage at the determined charge level and the reference degradation ratio does not exceed the cycle degradation ratio which is caused by the adjustment of the charge level.

The charge and discharge control unit 12 performs charge and discharge control of the battery 20 by using the determined value of the charge level at storage (step S509). Note that the specific method of charge and discharge control is similar to that in step S104 in FIG. 6, detailed description of which will thus not be repeated here.

Fourth Embodiment

Figure 15:
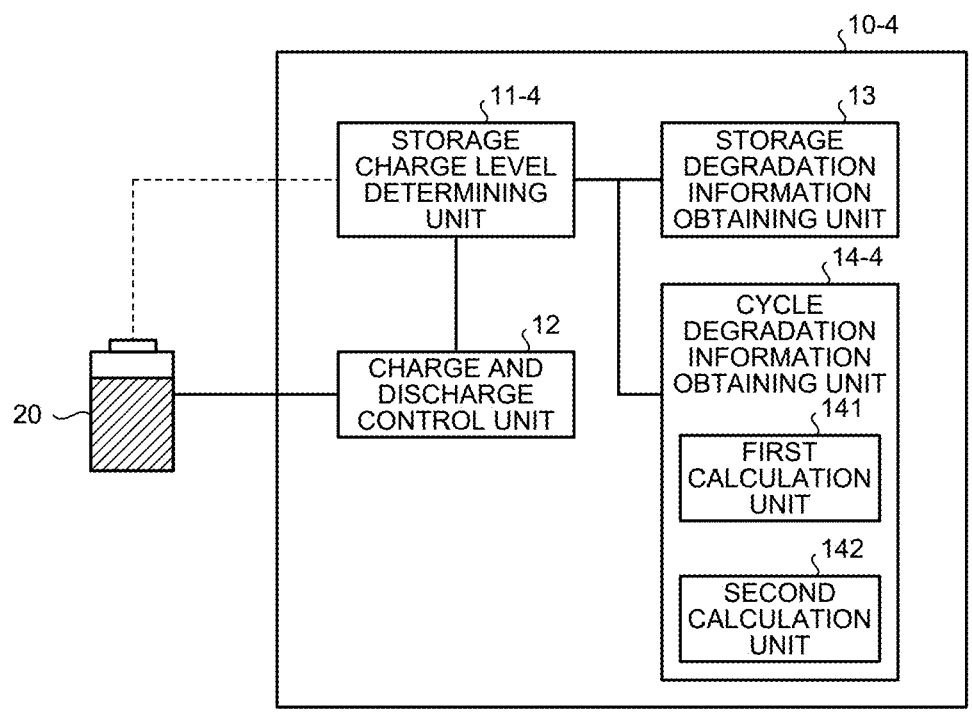
FIG. 15 is a diagram illustrating a functional configuration of a charge and discharge control device according to a fourth embodiment of the present invention.

FIG. 15 is a diagram illustrating a functional configuration of a charge and discharge control device 10-4 according to a fourth embodiment of the present invention. The charge and discharge control device 10-4 includes a storage charge level determining unit 11-4, the charge and discharge control unit 12, the storage degradation information obtaining unit 13, and a cycle degradation information obtaining unit 14-4.

The cycle degradation information obtaining unit 14-4 includes a first calculation unit 141 and a second calculation unit 142. The first calculation unit 141 calculates a first cycle degradation amount excluding the storage degradation during charging and discharging from the degradation caused by charging and discharging of the battery 20. The second calculation unit 142 calculates a second cycle degradation amount, which is a storage degradation amount included in the cycle degradation amount and which is the storage degradation amount during charging and discharging of the battery 20. For example, in a case where the cycle is performed at a charge level in a range of 20% to 80%, the second calculation unit 142 integrates the storage degradation ratios at the charge levels 20% to 80% to calculate the second cycle degradation amount. The cycle degradation information obtaining unit 14-4 outputs cycle degradation information indicating the first cycle degradation amount and the second cycle degradation amount to the storage charge level determining unit 11-4.

The storage charge level determining unit 11-4 can determine the charge level at storage on the basis of the storage degradation information, and the first cycle degradation amount and the second cycle degradation amount included in the cycle degradation information.

According to the charge and discharge control device 10-4 according to the fourth embodiment of the present invention, the first cycle degradation amount with the degradation rate being changed by the influence of the temperature, the electrical current value, and the cycle charge level range during charge and discharge of the battery 20, and the second cycle degradation amount, which is a storage degradation amount with the degradation rate being changed by the influence of the temperature and the cycle charge level range, can be calculated separately. Thus, changing the settings of the electrical current value and the cycle charge level range in charge and discharge control of the battery 20 enables more efficient charge and discharge control while reducing degradation.

Fifth Embodiment

Figure 16:
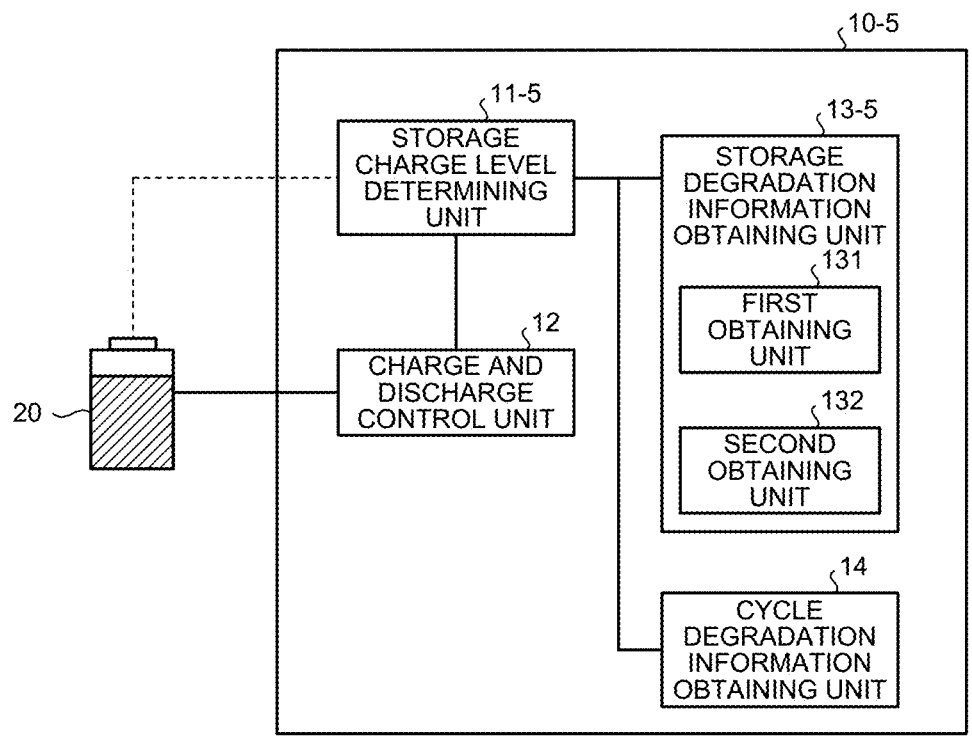
FIG. 16 is a diagram illustrating a functional configuration of a charge and discharge control device according to a fifth embodiment of the present invention.

FIG. 16 is a diagram illustrating a functional configuration of a charge and discharge control device 10-5 according to a fifth embodiment of the present invention. The charge and discharge control device 10-5 includes a storage charge level determining unit 11-5, the charge and discharge control unit 12, a storage degradation information obtaining unit 13-5, and the cycle degradation information obtaining unit 14.

The storage degradation information obtaining unit 13-5 includes a first obtaining unit 131 and a second obtaining unit 132. The first obtaining unit 131 obtains a storage degradation rate by using a first storage degradation pattern in which the degradation rate is higher in the second charge level range R2, which is a middle charge level range, than in the first charge level range R1 and the third charge level range R3, in correlation between the storage degradation rate and the charge level of the battery 20. The second obtaining unit 132 obtains a storage degradation rate by using a second storage degradation pattern in which the degradation rate is higher as the charge level is higher. The storage degradation rate of the battery 20 is a sum of the storage degradation rate obtained by the first obtaining unit 131 and the storage degradation rate obtained by the second obtaining unit 132.

Figure 17:
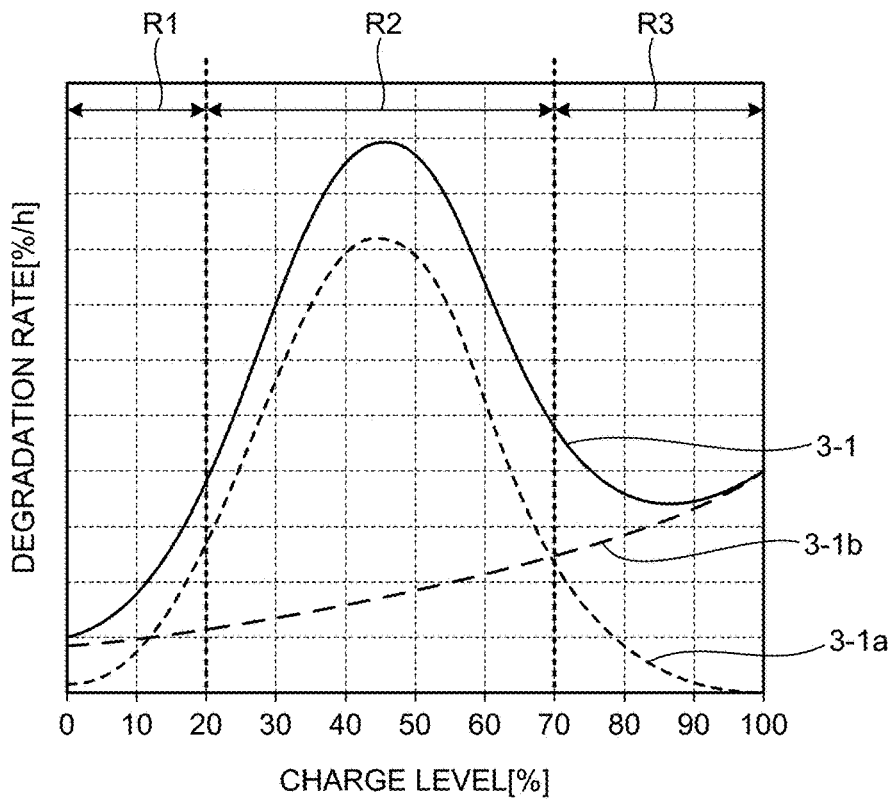
FIG. 17 is a graph for explaining a first obtaining unit and a second obtaining unit illustrated in FIG. 16.

FIG. 17 is a graph for explaining the first obtaining unit 131 and the second obtaining unit 132 illustrated in FIG. 16. FIG. 17 illustrates a degradation rate 3-1 with respect to the charge level of the battery 20, and a first storage degradation pattern 3-1a and a second storage degradation pattern 3-1b of the degradation rate 3-1.

Figure 18:
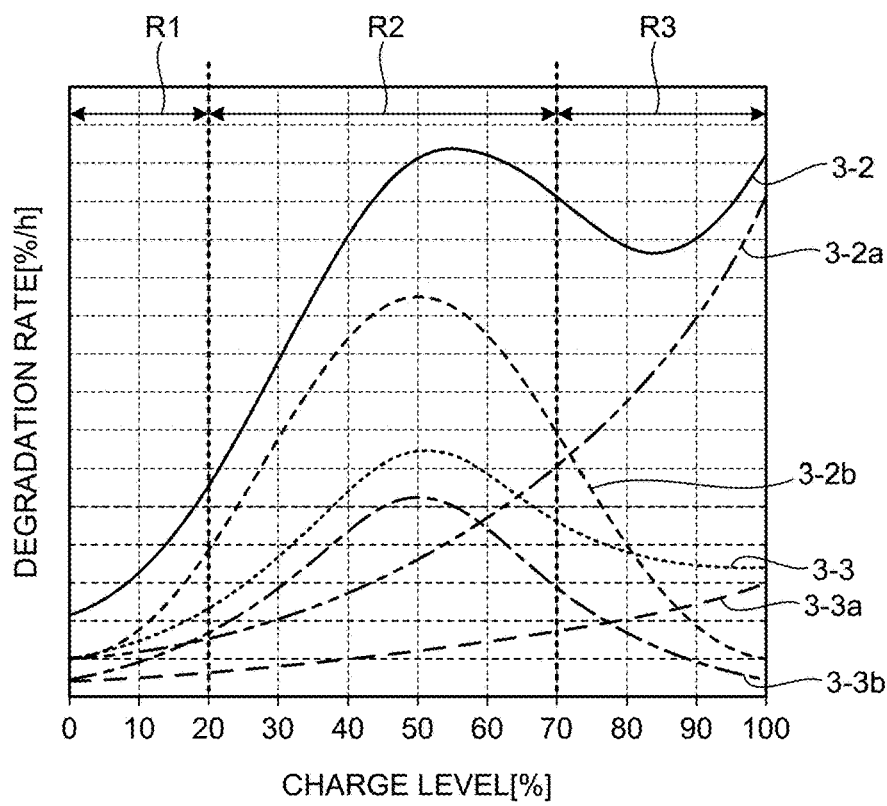
FIG. 18 is a graph illustrating degradation patterns of the battery illustrated in FIG. 16 depending on the temperature.

FIG. 18 is a graph illustrating degradation patterns of the battery 20 illustrated in FIG. 16 depending on the temperature. The first obtaining unit 131 obtains the storage degradation rate by using first storage degradation patterns 3-2a and 3-3a. The second obtaining unit 132 obtains the storage degradation rate by using second storage degradation patterns 3-2b and 3-3b. A degradation rate 3-2, the first storage degradation pattern 3-2a, and the second storage degradation pattern 3-2b represent storage degradation rates at a low temperature of 25° C. or lower, for example. A degradation rate 3-3, the first storage degradation pattern 3-3a, and the second storage degradation pattern 3-3b represent storage degradation rates at a high temperature of 45° C., for example.

As indicated by the degradation rate 3-2, when the degradation rate has a maximum value in the second charge level range R2, the storage charge level determining unit 11-5 determines whether or not the current charge level is included in the second charge level range R2, and, if the current charge level is included in the second charge level range R2, determines the charge level at storage to be a value included in the first charge level range or the third charge level range. As indicated by the degradation rate 3-3, when the degradation rate has a maximum value in the second charge level range R2 and in third charge level range R3, the storage charge level determining unit 11-5 can determine the charge level at storage to be a value in the first charge level range R1.

With this configuration, when the correlation between the degradation rates and the charge levels in the first storage degradation pattern and the second storage degradation pattern are changed by the temperature, charge and discharge control can be performed so that the degradation is reduced even when the correlation between the degradation rate and the charge level of the storage degradation, which is the sum of the first storage degradation pattern and the second storage degradation pattern, is changed by the temperature.

Figure 19:
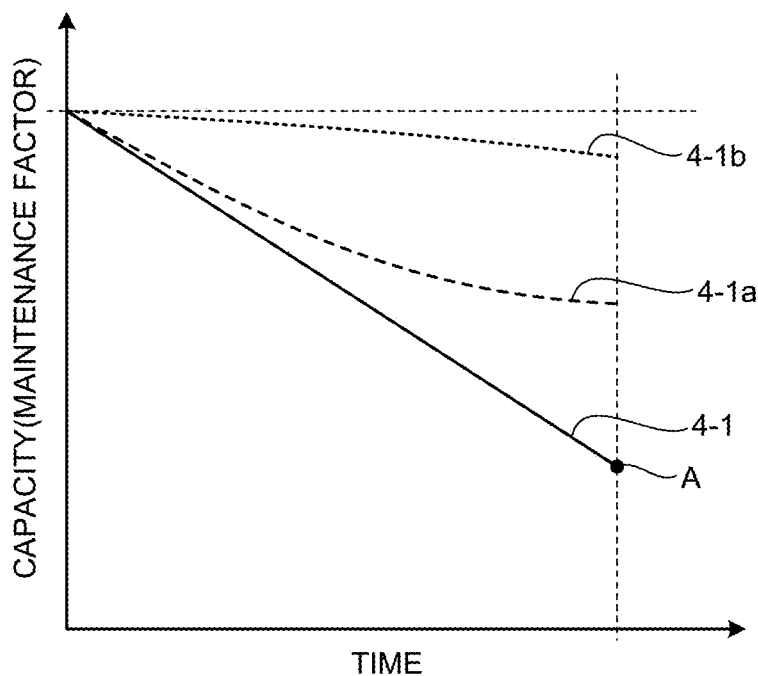
FIG. 19 is a graph illustrating a first example of a change over time of the capacity of the battery illustrated in FIG. 16.

FIG. 19 is a graph illustrating a first example of a change over time of the capacity of the battery 20 illustrated in FIG. 16. The degradation rate can be calculated on the basis of the correlation between a capacity decrease amount and time as illustrated in FIG. 19. FIG. 19 illustrates a temporal change of the capacity 4-1 of the battery 20. The capacity 4-1 is expressed by a sum of a first pattern 4-1a, in which the degradation is faster as the charge level is higher and the capacity lowers less quickly over time, and a second pattern 4-1b, in which the degradation is faster at a middle charge level and progresses with time. The first pattern 4-1a is typically linear with respect to the 0.5th power of time. The second pattern 4-1b is typically an exponential function or a linear function with respect to time.

The storage charge level determining unit 11-5 can also estimate the transition of the storage degradation of the battery 20 on the basis of the first pattern 4-1a and the second pattern 4-1b, and determine the charge level at storage in accordance with the estimation result. For example, in a case where the proportion of the first pattern 4-1a is higher than the second pattern 4-1b at a point A after elapse of a predetermined time in FIG. 19, the degradation rate is higher as the charge level is higher, and thus the charge level at storage of the battery 20 can be a value included in the first charge level range R1 or the second charge level range R2 instead of the third charge level range R3.

Figure 20:
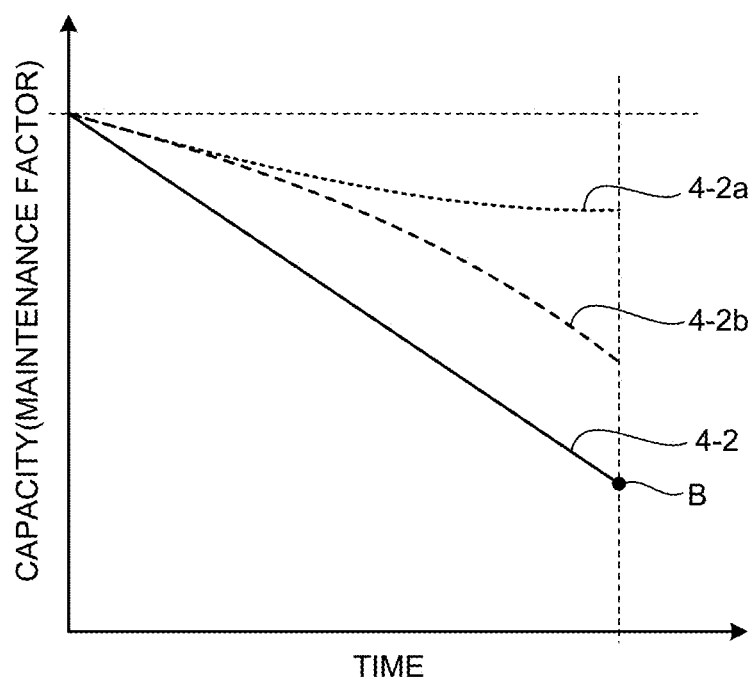
FIG. 20 is a graph illustrating a second example of a change over time of the capacity of the battery illustrated in FIG. 16.

FIG. 20 is a graph illustrating a second example of a change over time of the capacity of the battery 20 illustrated in FIG. 16. In the second example, the proportion of first pattern 4-2a is smaller than the second pattern 4-2b. In this case, degradation is faster in the second charge level range R2. Thus, the storage charge level determining unit 11-5 can determine the charge level at storage to be a value included in the first charge level range R1 or the third charge level range R3.

In addition, the storage charge level determining unit 11-5 can estimate a future degradation state of the battery 20 by determining which of the first patterns 4-1a and 4-2a and the second patterns 4-1b and 4-2b have more influence on the basis of the degradation states at points A and B after elapse of a predetermined time. The storage charge level determining unit 11-5 can inform the user of the timing for replacement of the battery 20.

While the storage degradation of the battery 20 is expressed in two patterns in FIGS. 19 and 20, the storage degradation may be expressed in three or more patterns. In a case where the storage degradation is expressed in three patterns, the storage degradation ratio of the battery 20 is a sum of three storage degradation ratios obtained by using three patterns.

Sixth Embodiment

Figure 21:
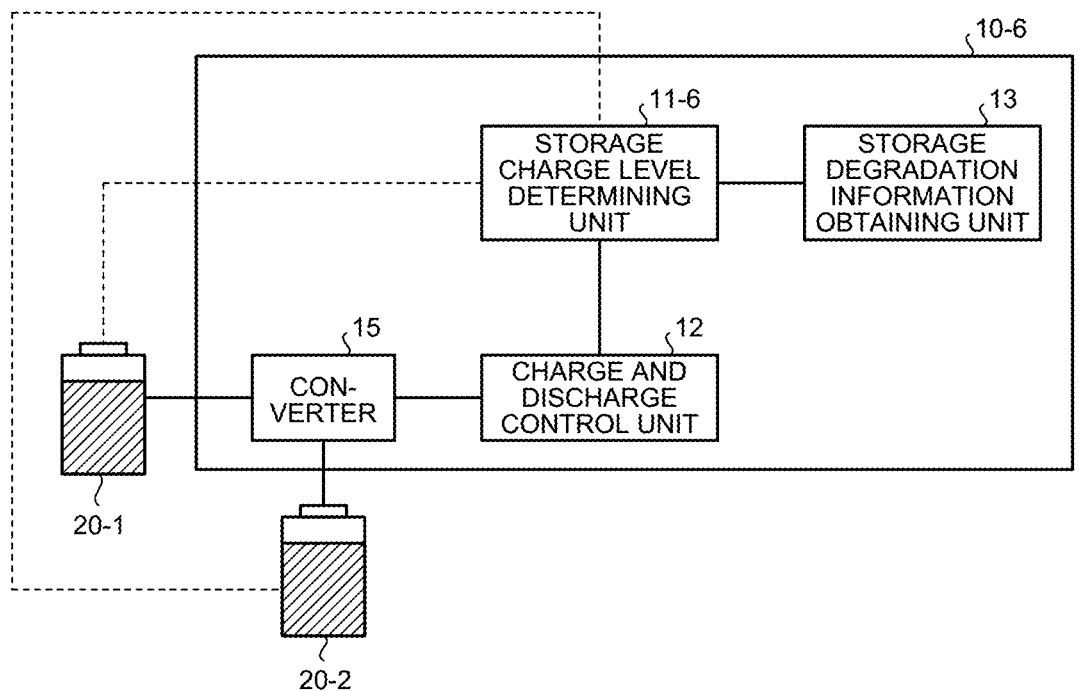
FIG. 21 is a diagram illustrating a functional configuration of a charge and discharge control device according to a sixth embodiment of the present invention.

FIG. 21 is a diagram illustrating a functional configuration of a charge and discharge control device 10-6 according to a sixth embodiment of the present invention. The charge and discharge control device 10-6 includes a storage charge level determining unit 11-6, the charge and discharge control unit 12, the storage degradation information obtaining unit 13, and a converter 15.

A plurality of batteries 20-1 and 20-2 are connected in parallel via the converter 15. While two batteries 20-1 and 20-2 are presented herein, the number of batteries 20 to be connected may be three or more, and a plurality of converters 15 may be provided. Alternatively, the batteries 20-1 and 20-2 may be connected in series.

The storage charge level determining unit 11-6 determines the charge level at storage of each of the batteries 20-1 and 20-2. In this process, the storage charge level determining unit 11-6 makes the output from one of the batteries 20-1 and 20-2 and the input to the other of the batteries 20-1 and 20-2 have the same value. The charge and discharge control unit 12 causes power to be delivered between batteries 20-1 and 20-2 to adjust the charge levels of the batteries 20-1 and 20-2.

Figure 22:
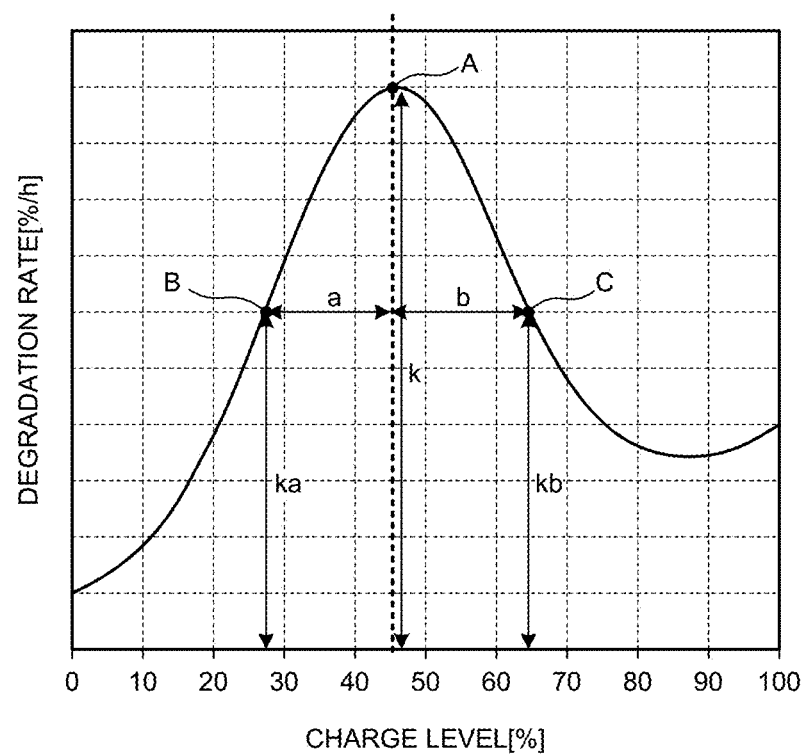
FIG. 22 is a graph illustrating a first example of charge level control of batteries illustrated in FIG. 21.

FIG. 22 is a graph illustrating a first example of charge level control of the batteries 20-1 and 20-2 illustrated in FIG. 21. FIG. 22 illustrates correlation between the degradation rates and the charge levels of the batteries 20-1 and 20-2. In the first example, both of the batteries 20-1 and 20-2 have a characteristic of faster degradation in the second charge level range R2 than in the first charge level range R1 and the third charge level range R3. In this case, when the charge level at which the batteries 20-1 and 20-2 are desired to be used is a point A, the charge level of the battery 20-1 is set to a point B, and the charge level of the battery 20-2 is set to a point C. The difference a between the point B and the point A and the difference b between the point C and the point A are in a relation of a=b. When the charge levels of the batteries 20-1 and 20-2 are both set to the point A, the sum of the degradation rates is 2 k. On the other hand, when the average charge level of the batteries 20-1 and 20-2 is set to the point A desired to be used, the degradation rate of the battery 20-1 is ka, the degradation rate of the battery 20-2 is kb, and the sum of the degradation rates is ka+kb. ka+kb is smaller than 2 k, and the degradation rate can therefore be reduced.

Thus, when the storage time is t, the charge and discharge control device 10-6 causes power to be delivered between the batteries 20-1 and 20-2 so that the charge level at storage (ka+kb)t of the batteries 20-1 and 20-2 is lower than 2 kt. Alternatively, the charge and discharge control device 10-6 causes power to be delivered between the batteries 20-1 and 20-2 so that the charge level of one of the batteries 20-1 and 20-2 falls within the first charge level range R1 and that of the other thereof falls within the third charge level range R3.

Figure 23:
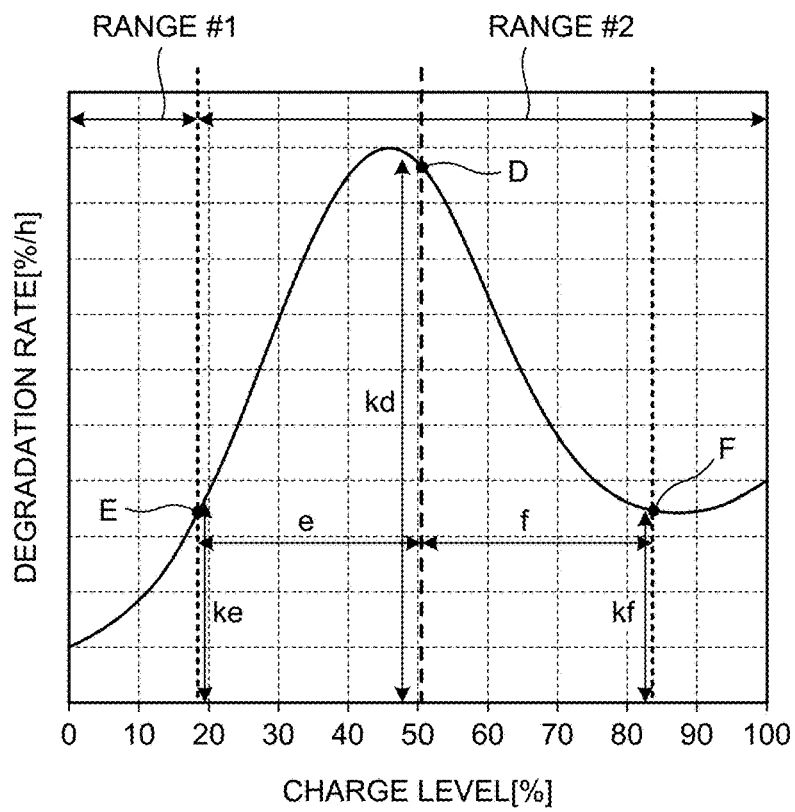
FIG. 23 is a graph illustrating a second example of charge level control of the batteries illustrated in FIG. 21.

FIG. 23 is a graph illustrating a second example of charge level control of the batteries 20-1 and 20-2 illustrated in FIG. 21. When the batteries 20-1 and 20-2 are desired to be used at a point D, one of the batteries 20-1 and 20-2 is used at a point E, and the other thereof is used at a point F. The difference e between the charge levels at the points D and E and the difference f between the charge levels at the points D and F satisfy the relation of e=f. The degradation rate ke+kf when the battery 20-1 is used at the point E and the battery 20-2 is used at the point F is smaller than the degradation rate 2kd when the batteries 20-1 and 20-2 are used at the point D, which can reduce the degradation.

At the point F, however, the degradation rate has the minimum value in the third charge level range R3 of the batteries 20-1 and 20-2, and the degradation rate in the range #1 is smaller than that at the point F, for example. Thus, when one of the batteries 20-1 and 20-2 is used in the range #1, the degradation varies between the two batteries 20-1 and 20-2. The charge levels of the batteries 20-1 and 20-2 may therefore be controlled so as to be within a range #2 excluding the range #1. In this case, the variation in degradation between the batteries 20-1 and 20-2 can be reduced. In addition, when the degradation varies between the batteries 20-1 and 20-2, the charge levels thereof may be adjusted on purpose so that the more degraded one of the batteries 20-1 and 20-2 is used in the range #1 and the less degraded one thereof is used in the range #2.

Figure 24:
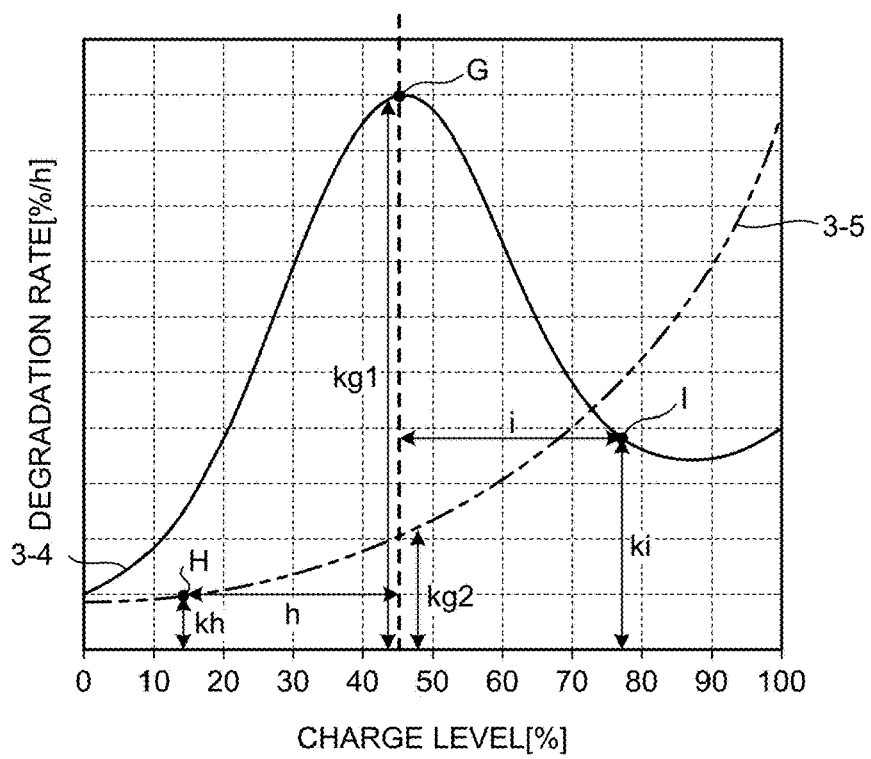
FIG. 24 is a graph illustrating a third example of charge level control of the batteries illustrated in FIG. 21.

FIG. 24 is a graph illustrating a third example of charge level control of the batteries 20-1 and 20-2 illustrated in FIG. 21. The battery 20-1 deteriorates faster in the second charge level range R2 than in the first charge level range R1 and the third charge level range R3. The battery 20-2 has a maximum value of the degradation rate in the third charge level range R3. In this case, at a point G of the charge levels of the batteries 20-1 and 20-2 desired to be used, the degradation rate of the battery 20-1 is kg1, the degradation rate of the battery 20-2 is kg2, and the sum of the degradation rates is kg1+kg2. When an adjusted charge level of the battery 20-1 is at a point I and an adjusted charge level of the battery 20-2 is at a point H, the relation between the difference i between the charge levels at the point G and the point I and the difference h between the charge levels at the point G and the point H is h=i. In this case, the sum of the degradation rate ki of the battery 20-1 and the degradation rate kh of the battery 20-2 is ki+kh.

Thus, when the storage time is represented by t, the charge levels at storage of the batteries 20-1 and 20-2 are determined so that the relation of h=i is satisfied and that the adjusted storage degradation rate (ki+kh)t is smaller than (kg1+kg2)t. Power is delivered between the batteries 20-1 and 20-2 to adjust the charge levels. This configuration adjusts the charge levels of the battery 20-1 having the maximum value of the degradation rate at a middle charge level and the battery 20-2 having a higher degradation rate as the charge level is higher, so that the degradation rates of both of the batteries 20-1 and 20-2 become smaller. This enables control of degradation while reducing power consumption.

Seventh Embodiment

Figure 25:
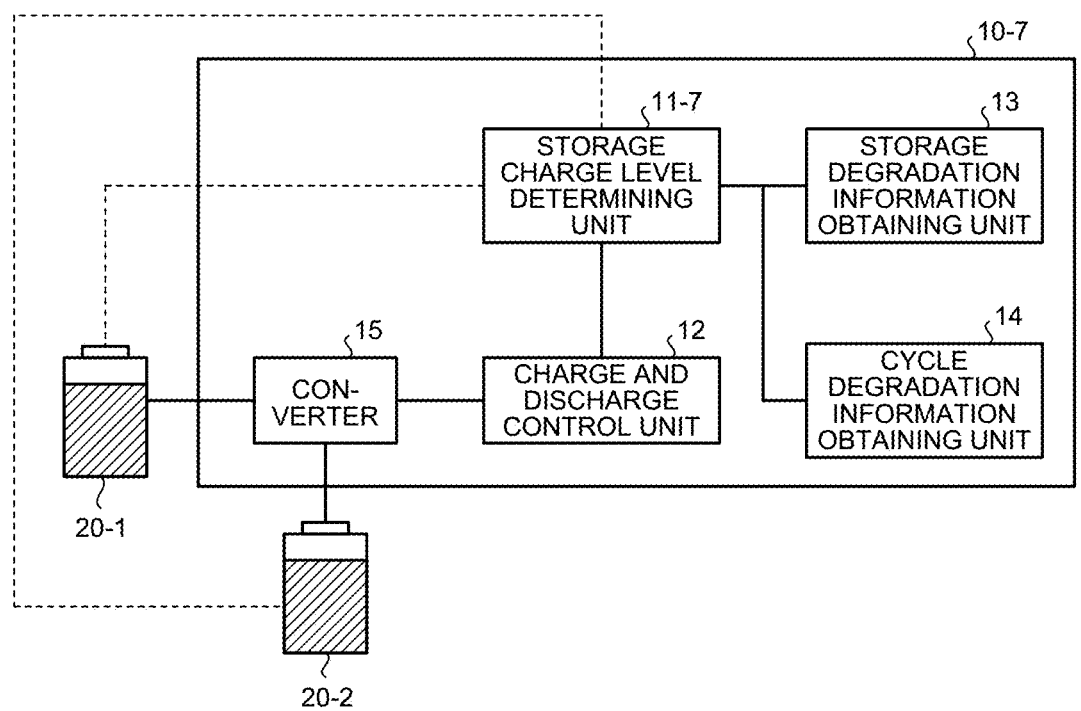
FIG. 25 is a diagram illustrating a functional configuration of a charge and discharge control device according to a seventh embodiment of the present invention.

FIG. 25 is a diagram illustrating a functional configuration of a charge and discharge control device 10-7 according to a seventh embodiment of the present invention. The charge and discharge control device 10-7 includes a storage charge level determining unit 11-7, the charge and discharge control unit 12, the storage degradation information obtaining unit 13, the cycle degradation information obtaining unit 14, and a converter 15. The charge and discharge control device 10-7 has a configuration additionally including the cycle degradation information obtaining unit 14 in the charge and discharge control device 10-6.

The storage charge level determining unit 11-7 inputs the cycle charge level range, the electrical current value, and the temperature in power delivery between the batteries 20-1 and 20-2 to the cycle degradation information obtaining unit 14 to cause the cycle degradation information obtaining unit 14 to obtain cycle degradation information. The cycle degradation information obtaining unit 14 thus obtains cycle degradation ratios caused by power delivery between the batteries 20-1 and 20-2. The storage charge level determining unit 11-7 determines the charge level at storage on the basis of the cycle degradation ratios, which are the cycle degradation information obtained by the cycle degradation information obtaining unit 14.

As described above, according to the seventh embodiment of the present invention, degradation can be reduced as a whole in view of not only the storage degradations but also the cycle degradations of the batteries 20-1 and 20-2.

Next, a hardware configuration of the charge and discharge control devices 10-1 to 10-7 according to the first to seventh embodiments of the present invention will be described. The individual functional units of the charge and discharge control devices 10-1 to 10-7 are implemented by processing circuitry. The processing circuitry may be implemented by dedicated hardware, or may be a control circuit using a central processing unit (CPU).

Figure 26:
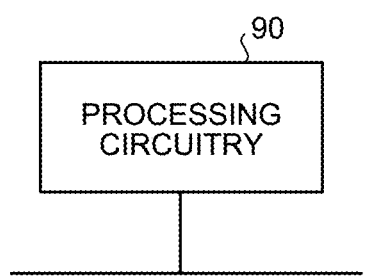
FIG. 26 is a diagram illustrating dedicated hardware for implementing the functions of the charge and discharge control devices according to the first to seventh embodiments of the present invention.

In a case where the processing circuitry is implemented by dedicated hardware, the components are implemented by processing circuitry 90 illustrated in FIG. 26. FIG. 26 is a diagram illustrating dedicated hardware for implementing the functions of the charge and discharge control devices 10-1 to 10-7 according to the first to seventh embodiments of the present invention. The processing circuitry 90 is a single circuit, a composite circuit, a programmed processor, a parallel-programmed processor, an application specific integrated circuit (ASIC), a field programmable gate array (FPGA), or a combination thereof.

Figure 27:
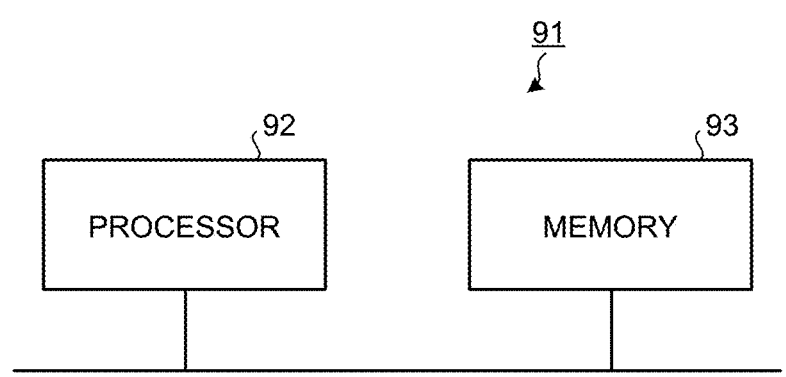
FIG. 27 is a diagram illustrating a configuration of a control circuit for implementing the functions of the charge and discharge control devices according to the first to seventh embodiments of the present invention.

In a case where the processing circuitry is implemented by a control circuit using a CPU, the control circuit is a control circuit 91 having a configuration illustrated in FIG. 27, for example. FIG. 27 is a diagram illustrating a configuration of the control circuit 91 for implementing the functions of the charge and discharge control devices 10-1 to 10-7 according to the first to seventh embodiments of the present invention. As illustrated in FIG. 27, the control circuit 91 includes a processor 92, and a memory 93. The processor 92 is a CPU, and is also referred to as a central processing device, a processing device, a computing device, a microprocessor, a microcomputer, a digital signal processor (DSP), or the like. The memory 93 is a nonvolatile or volatile semiconductor memory such as a random access memory (RAM), a read only memory (ROM), a flash memory, an erasable programmable ROM (EPROM), or an electrically EPROM (EEPROM; registered trademark), a magnetic disk, a flexible disk, an optical disk, a compact disc, a mini disc, a digital versatile disk (DVD), or the like, for example.

In a case where the processing circuitry is implemented by the control circuit 91, the processing circuitry is implemented by the processor 92 reading and executing programs corresponding to the processes of the components stored in the memory 93. In addition, the memory 93 is also used as a temporary memory in processes performed by the processor 92.

The configurations presented in the above embodiments are examples of the present invention, and can be combined with other known technologies or can be partly omitted or modified without departing from the scope of the present invention.

For example, the storage degradation information obtaining units 13 illustrated in FIGS. 15, 21, and 25 can be each replaced with the storage degradation information obtaining unit 13-5 illustrated in FIG. 16. In addition, the cycle degradation information obtaining unit 14 illustrated in FIG. 25 can be replaced with the cycle degradation information obtaining unit 14-4 illustrated in FIG. 15.

For example, the operations in the illustrated flowcharts can be combined, and the order in which the operations are performed may be changed as long as similar effects are produced. In addition, a plurality of operations may be performed in parallel as long as the operations caused by the respective operations do not change.

In addition, the functions described in the first to seventh embodiments may obviously be implemented as the charge and discharge control devices 10-1 to 10-7, or may also be implemented as a charge and discharge control method, or as a computer programs describing individual operations in the charge and discharge control method. The computer programs may be provided via a communication channel, or may be recorded on a recording medium and provided therefrom.

REFERENCE SIGNS LIST

10-1 to 10-7 charge and discharge control device; 11-1 to 11-7 storage charge level determining unit; 12 charge and discharge control unit; 13, 13-5 storage degradation information obtaining unit; 14, 14-4 cycle degradation information obtaining unit; 15 converter; 20, 20-1, 20-2 battery; 90 processing circuitry; 91 control circuit; 92 processor; 93 memory; 131 first obtaining unit; 132 second obtaining unit; 141 first calculation unit; 142 second calculation unit.

The invention claimed is:

1. A charge and discharge control device electrically connected to a battery of a vehicle, comprising:
processing circuitry configured to:
obtain storage degradation information indicating a magnitude of storage degradation of the battery of the vehicle on the basis of a charge level of the battery of the vehicle, the storage degradation being degradation of the battery of the vehicle over time exclusive of charge and discharge of the battery of the vehicle;
obtain cycle degradation information indicating a magnitude of battery degradation caused by the charge and discharge of the battery of the vehicle;
select one charge level range from among (i) a first charge level range entirely lower than a second charge level range, and (ii) a third charge level range entirely higher than the second charge level range;
determine a charge level at storage during which the charge and discharge of the battery of the vehicle are not performed for which to set the charge level of battery at upon reaching a condition where the charge and discharge of the battery of the vehicle is stopped on a basis of the storage degradation information and the cycle degradation information, the second charge level range corresponding to a maximum value of the storage degradation;
set a storage time and a charging time responsive to the determined charge level at storage being within the second charge level range;
select one of the first charge level range or the third charge level range based on whether the storage time is greater than the charging time; and
perform selective control to one of charge or discharge of the battery of the vehicle on the basis of the determined charge level at storage and the selected one of the first charge level range or the third charge level range.

2. The charge and discharge control device according to claim 1, wherein a material containing manganese is used for a positive electrode of the battery of the vehicle.

3. The charge and discharge control device according to claim 1, wherein when a current charge level is included in the first charge level range, the processing circuitry determines the current charge level to be the charge level at storage, and starts charging at a time point being a charging time required for charging to a target charge value before an end point of the storage time.

4. The charge and discharge control device according to claim 1, wherein the first charge level range is selected under a condition where the storage time is greater than the charging time.

5. The charge and discharge control device according to claim 1, wherein the processing circuitry determines the charge level at storage on the basis of (a) a first storage degradation amount under a condition where the battery of the vehicle is stored at a current charge level, (b) a second storage degradation amount under a condition where the battery of the vehicle is stored at an adjusted charge level, and (c) a cycle degradation amount caused by charge and discharge for the adjustment.

6. The charge and discharge control device according to claim 5, wherein the processing circuitry determines the charge level at storage on the basis of (a) a first degradation amount in a first case of storage at the current charge level and (b) a second degradation amount obtained by adding the cycle degradation amount caused by charge and discharge for the adjustment in a second case of storage at the adjusted charge level.

7. The charge and discharge control device according to claim 1, wherein
the processing circuitry obtains the storage degradation information of a plurality of batteries of the vehicle, including said battery of the vehicle,
the processing circuitry obtains cycle degradation information indicating a cycle degradation amount caused by power delivery between the batteries of the vehicle,
the processing circuitry determines a charge level at storage of each of the batteries of the vehicle on the basis of the storage degradation information and the cycle degradation information obtained for the batteries of the vehicle, and
the processing circuitry causes power to be delivered between the batteries of the vehicle to adjust charge levels of the batteries of the vehicle.

8. The charge and discharge control device according to claim 7, wherein the processing circuitry controls charge and discharge of the batteries of the vehicle within a range in which the storage degradation is larger than a minimum value of the storage degradation included in the first charge level range.

9. The charge and discharge control device according to claim 1, wherein
the processing circuitry obtains plural different storage degradation information each indicating a corresponding one of a plurality of storage degradation patterns, the storage degradation patterns being different from each other, and a magnitude of storage degradation of the battery is expressed by a sum of the plurality of storage degradation patterns different from each other.

10. The charge and discharge control device according to claim 9, wherein the storage degradation patterns include a first pattern in which the storage degradation has the maximum value of storage degradation in the second charge level range, and a second pattern in which the storage degradation does not have the maximum value in the first charge level range.

11. The charge and discharge control device according to claim 9, wherein the storage degradation patterns each indicate a pattern of a decrease in a capacity of the battery of the vehicle over time, and the processing circuitry estimates transition of the storage degradation of the battery of the vehicle on the basis of the obtained plural different storage degradation information, and determines the charge level at storage in accordance with a result of the estimation.

12. A charge and discharge control method for a battery of a vehicle, comprising:

obtaining, using processing circuitry, a current charge level of a battery having a maximum value corresponding to a maximum value of a storage degradation ratio, being a degradation ratio over time, in a second charge level range higher than a first charge level range and lower than a third charge level range;

obtaining, using the processing circuitry, storage degradation information indicating a magnitude of storage degradation of the battery of the vehicle, the storage degradation being degradation of the battery of the vehicle over time exclusive of charge and discharge of the battery of the vehicle, on the basis of a current charge level of the battery of the vehicle;

obtaining, using the processing circuitry, cycle degradation information indicating a magnitude of degradation of the battery of the vehicle caused by the charge and discharge of the battery of the vehicle;

selecting, automatically using the processing circuitry, one charge level range from among (i) the first charge level range and (ii) the third charge level range;

determining, automatically using the processing circuitry, a charge level at storage during which the charge and discharge of the battery of the vehicle are not performed for which to set the charge level of battery at upon reaching a condition where the charge and discharge of the battery of the vehicle is stopped, within the selected first or third charge level range on the basis of the storage degradation information and the cycle degradation information;

setting a storage time and a charging time responsive to the determined charge level at storage being within the second charge level range;

selecting one of the first charge level range or the third charge level range based on whether the storage time is greater than the charging time; and performing selective control, automatically using the processing circuitry, to perform one of charge or discharge of the battery of the vehicle on the basis of the determined charge level at storage and the selected one of the first charge level range or the third charge level range.

13. The charge and discharge control method according to claim 12, wherein the third charge level range is selected under a condition where the storage time is not greater than the charging time.

* * * * *